(12) United States Patent
Nakazato et al.

(10) Patent No.: US 6,753,568 B1
(45) Date of Patent: Jun. 22, 2004

(54) MEMORY DEVICE

(75) Inventors: Kazuo Nakazato, Cambridge (GB); Kiyoo Itoh, Tokyo (JP); Hiroshi Mizuta, Tokyo (JP); Toshihiko Sato, Cambridge (GB); Toshikazu Shimada, Tokyo (JP); Haroon Ahmed, Cambridge (GB)

(73) Assignee: Hitachi, LTD., Tokyo (JP)

( * ) Notice: Subject to any disclaimer, the term of this patent is extended or adjusted under 35 U.S.C. 154(b) by 0 days.

(21) Appl. No.: 09/362,200

(22) Filed: Jul. 28, 1999

Related U.S. Application Data

(63) Continuation of application No. 08/958,845, filed on Oct. 28, 1997, now Pat. No. 5,952,692.

(30) Foreign Application Priority Data

Nov. 15, 1996 (EP) ............................................. 96308283

(51) Int. Cl.[7] .............................................. H01L 29/76
(52) U.S. Cl. ...................... 257/314; 257/314; 257/315; 257/316; 257/318; 257/319; 257/320; 257/321; 257/324; 257/325; 257/326; 257/410; 257/411; 257/635; 257/636; 257/637
(58) Field of Search ................................. 257/314, 315, 257/316, 318, 319, 320, 326, 321, 324, 325, 410, 411, 635, 636, 637

(56) References Cited

U.S. PATENT DOCUMENTS

| | | | |
|---|---|---|---|
| 3,878,549 A | 4/1975 | Yamazaki et al. ............ 357/23 |
| 4,462,089 A | 7/1984 | Miida et al. | |
| 4,698,787 A | 10/1987 | Mukherjee et al. | |

(List continued on next page.)

FOREIGN PATENT DOCUMENTS

| EP | 0 642 173 | 3/1995 |
|---|---|---|
| FR | 2 111 866 | 6/1972 |
| GB | WO 94/15340 | 7/1994 |
| JP | 55087490 | 7/1980 |
| JP | 5061876 | 5/1981 |
| JP | 61294688 | 12/1986 |
| JP | 62035572 | 2/1987 |
| JP | 62049670 | 3/1987 |
| JP | 1115165 | 5/1989 |
| JP | 2110979 | 4/1990 |
| JP | 5028778 | 2/1993 |
| JP | 5055600 | 3/1993 |
| JP | 5226611 | 9/1993 |
| JP | 6291330 | 10/1994 |
| JP | 713520 | 5/1995 |

OTHER PUBLICATIONS

IEEE Transactions on Electron Devices, vol. 43, No. 9, Sep. 1998, pp. 1553–1558, Hanati et al.; *Fast and Long Retention–Time Nano–Crystal Memory*.
Microelectronic Engineering, vol. 32, No. 1/04, Sep. 1996, pp. 297–315, H. Ahmed et al.: *Single–Electron Devices*.
Physical Review, B. Condensed Matter, vol. 50, No. 12, Sep. 15, 1994, pp. 8961–8964, Bar–Sadeh et al.: *Single–Electron Tunneling Effects in Granular Metal Films*.

(List continued on next page.)

*Primary Examiner*—George Eckert
(74) *Attorney, Agent, or Firm*—Kenyon & Kenyon

(57) ABSTRACT

A memory device includes a memory node (1) to which charge is written through a tunnel barrier configuration (2) from a control electrode (9). The stored charge effects the conductivity of a source/drain path (4) and data is read by monitoring the conductivity of the path. The charge barrier configuration comprises a multiple tunnel barrier configuration, which may comprise alternating layers (16) of polysilicon of 3 nm thickness and layers (15) of $Si_3N_4$ of 1 nm thickness, overlying polycrystalline layer of silicon (1) which forms the memory node. Alternative barrier configurations (2) are described, including a Schottky barrier configuration, and conductive nanometer scale conductive islands (30, 36, 44), which act as the memory node, distributed in an electrically insulating matrix.

50 Claims, 22 Drawing Sheets

U.S. PATENT DOCUMENTS

| | | | |
|---|---|---|---|
| 5,101,249 A | | 3/1992 | Hijiya et al. |
| 5,216,262 A | | 6/1993 | Tsu ............................ 257/411 |
| 5,265,057 A | * | 11/1993 | Furuyama et al. .......... 365/201 |
| 5,286,994 A | | 2/1994 | Ozawa et al. ................ 257/324 |
| 5,319,229 A | | 6/1994 | Shimoji et al. ............. 257/324 |
| 5,391,912 A | * | 2/1995 | Horiuchi et al. ............ 257/588 |
| 5,512,773 A | | 4/1996 | Wolf et al. |
| 5,604,357 A | | 2/1997 | Hori ............................ 257/324 |
| 5,619,052 A | * | 4/1997 | Chang et al. ............... 257/321 |
| 5,714,766 A | * | 2/1998 | Chen et al. ................... 257/17 |
| 5,952,692 A | * | 9/1999 | Nakazato et al. ........... 257/321 |
| 5,962,890 A | * | 10/1999 | Sato ............................ 257/320 |
| 6,172,397 B1 | * | 1/2001 | Oonakado et al. .......... 257/321 |

OTHER PUBLICATIONS

IEEE Transactions on Electron Devices, vol. 41, No. 9, Sep. 1994, pp. 1628–1638, K. Yano et al.: *Room–Temperature Single–Electron Memory*.

1996 IEEE International Solid–State Circuits Conference, pp. 266–268, K. Yano et al.: *Single–Electron–Memory Integrated Circuit for Giga–to–Tera Bit Storage*.

Appl. Phys.Lett. 68 (10), Mar. 4, 1996, pp. 1377–1379, Sandip Tiwan et al.: *A Silicon Nanocrystals–based Memory*.

IEEE Electron Device Letters, vol. EDL 1. No. 9, Sep. 1980, pp. 179–181, DiMaria et al.: *Electrically–Alterable Memory Using A Duel Electron Injector Structure*.

* cited by examiner store write

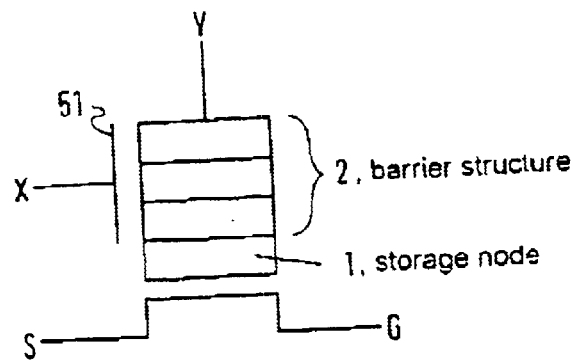
FIG. 17
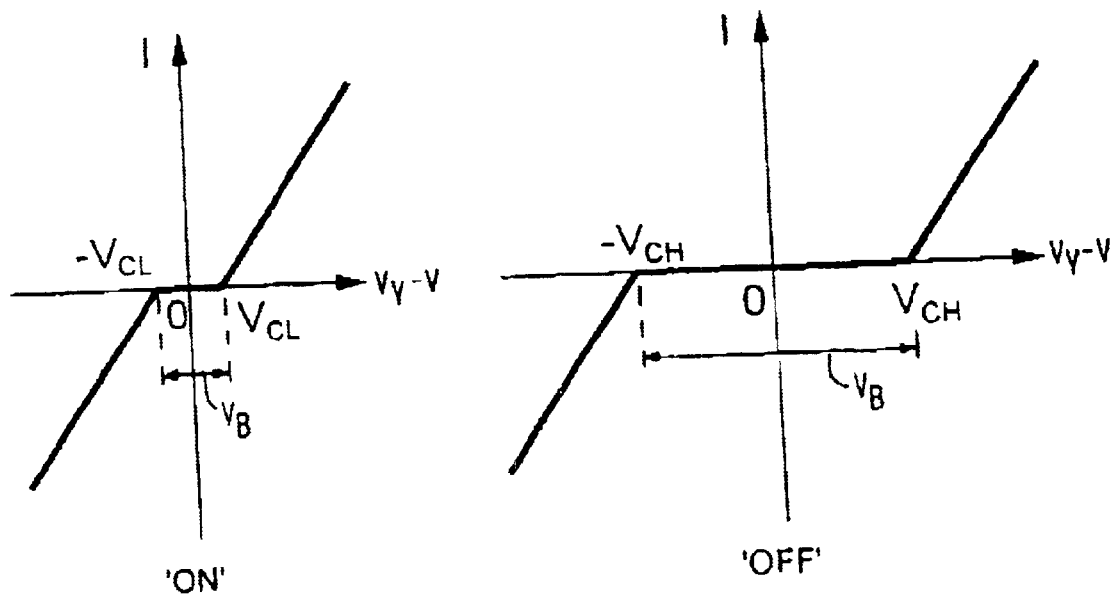
'ON'
FIG. 18A
'OFF'
FIG. 18B

WRITE OPERATION

MEMORY DEVICE

This application is a Continuation Application of application Ser. No. 08/958,845, filed Oct. 28, 1997, now U.S. Pat. No. 5,952,692.

FIELD OF THE INVENTION

This invention relates to a memory device capable of very large scale integration to provide a memory cell array.

BACKGROUND

In conventional semiconductor memories, one bit of information is represented by electrons stored in a static capacitor in each memory cell. The binary number "1" is represented by a deficit of N electrons and "0" is represented by a neutral charge state. In a typical 16 Mbit dynamic random access memory (DRAM), the number of electrons N is around 800,000. In order to increase the memory capacity, the individual memory cells need to be made smaller, but this cannot be achieved simply by scaling down the conventional memory cell because there is a lower limit to the value of N. The number of electrons N is limited by the need to accommodate leakage current from the cell, internal noise and the effect of incident alpha particles, and these factors do not reduce commensurately with a reduction in the area of the memory cell. It can be estimated that N must be in excess of 130,000 in a 16 Gbit DRAM i.e a factor of approximately 6 times less than for a 16 Mbit DRAM. However, the cell size required for a 16 Gbit DRAM needs to reduce by the factor of three orders of magnitude as compared with a 16 Mbit DRAM and consequently, the reduced cell size cannot accommodate the number of electrons required for satisfactory operation. In an attempt to maintain the value of N sufficiently large, three dimensional capacitors with trench or stacked structures, together with high dielectric capacitor films have been investigated but the resulting proposed structures and fabrication processes become extremely complicated. Furthermore, the power consumption increases significantly because the relatively large number N of electrons in the cells need to be refreshed within a storage time which tends to become shorter as the scale of the device is miniaturised.

Another type of memory device is known as a flash memory, which exhibits non-volatile characteristics. In such a device, approximately $10^5$ electrons are injected into a floating gate through a tunnelling barrier, typically formed of $SiO_2$ with a thickness of the order of 10 nm. The stored charge produces a field which influences current flow in a source-drain path. Charge is either written to or erased from the floating gate by application of an electric field through a control gate. A relatively high electric field is applied during the erase and write cycles and as a result the $SiO_2$ film is degraded, limiting the life of the memory to a predetermined number of erase/write cycles, typically of the order of $10^5$ cycles. Furthermore, the erase/write times are typically several milliseconds, four orders of magnitude slower than that of a conventional DRAM. Such poor performance limits the application of flash memory devices.

Hitherto, alternative approaches have been proposed to provide memory devices which operate with small, precise numbers of electrons, known as single electron memory devices. A single electron memory device is described in our PCT/GB93/02581 (WO-A-94/15340). A precise number of electrons enter or leave a memory node through a multiple tunnel junction under the control of applied gate voltages and the electron state at the memory node is detected by means of an electrometer. However, a disadvantage of the device is that a significant amount of circuitry is required for each memory node and the device currently operates only at low temperature, below the liquid helium temperature of 4.2K. Another single electron memory device has been proposed and demonstrated by K. Yano, T. Ishii, T. Hashimoto, T. Kobayasi, F. Murai and K. Seki in IEEE Transactions on Electron Devices, September 1994, Vol. 41, No. 9, pp. 1628–1638, and by K. Yano, T. Ishii, T. Sano, T. Mine, F. Murai and K. Seki in 1996 IEEE International Solid-State Circuits Conference, 1996, FP 16.4, p. 266. The device utilises a polycrystalline film extending between a source and drain, to which a gate voltage is applied. A small number of electrons is stored in the granular structure of the polycrystalline silicon film. The memory size is relatively small as compared with the structure in PCT/GB93/02581 supra and is operable at room temperature. Furthermore, the memory shows several advantages as compared with conventional flash memory, with a faster erase/write time due to the small number of stored electrons, and the operational lifetime is improved because low-voltage tunnel injection is utilised rather than high-field electron injection. However, the time to read stored information is relatively long, of the order of several microseconds, because the resistance between the source and drain needs to be sufficiently high to ensure long storage time of electrons in the grains.

Another structure is described by S. Tiwari, F. Rana, H. Hanafi, A. Hartstein, E. F. Crabbe and K. Chan in Applied Physics Letters, 4 Mar. 1996, Vol 68, No. 10, pp. 1377–1379, by S. Tiwari, F. Rana, K. Chan, L. Shi and H. Hanafi in Applied Physics Letters, 26 Aug. 1996, Vol 69, No. 9, pp. 1232–1234, and H. I. Hanafi, S. Tiwari and I. Khan in IEEE Transactions on Electron Devices, 9 Sep. 1996, Vol 43, No. 9, pp 1553–1558. This memory device utilises silicon-crystals that underlie the gate of a transistor device. Electrons are injected into the silicon nano-crystals, which are 5 nm in dimension, from the silicon substrate through a thin tunnelling oxide layer of the order of 1.1–1.8 nm thickness. Stored electrons shift the threshold voltage of the transistor. The time to read stored information is relatively short, of the order of several tens of nanoseconds, because the transistor channel has a high electron mobility. The endurance cycle for writing and erasing information is significantly improved relative to a conventional flash memory device. However, the erase time is unsatisfactorily long, of the order of several milliseconds because the conduction band alignment is unfavourable for electrons to tunnel from the nano-crystals into the bulk silicon.

Another memory device which operates according to the principles of flash memory is disclosed in Electrically-Alterable Memory Using a Dual Electron Injector Structure, D. J. DiM aria, K. M. DeMeyer and D. W. Dong, IEEE Electron Device Letters, Vol. EDL-1, No.9, September 1980, pp.179–181. In this device, the conductivity of the source/drain path is controlled by charge written or erased from a floating gate through a tunnelling barrier from a gate electrode. However, disadvantages of this device are that it has a slow writing/erasing time, of the order of milliseconds, and that the life of the tunnel barrier is limited because Fowler-Nordheim high field injection is used as in a conventional flash memory. A similar device is described in U.S. Pat. No. 3,878,549 to S. Yamazaki

SUMMARY OF THE INVENTION

With a view to overcoming these problems and disadvantages the invention provides a memory device comprising a path for charge carriers, a node for storing charge to produce a field which alters the conductivity of the path, and a tunnel barrier configuration through which charge carriers tunnel in response to a given voltage so as to become stored on the node, the tunnel barrier configuration exhibiting an energy band profile that comprises a dimensionally relatively wide barrier component with a relatively low barrier height, and at least one dimensionally relatively narrow barrier component with a relatively high barrier height.

The invention permits the writing, reading and erasing times for the memory device all to be optimised.

The relatively wide barrier component of the energy band profile acts as a barrier for long term storage of charge on the node. The wide barrier component can be raised and lowered selectively so that charge can then tunnel through the relatively narrow barrier component so as to be written onto or erased from the node.

The component of the energy band profile that has a relatively high barrier height may be provided by an element with a width of 3 nm or less. A plurality of the relatively high barrier components may be included and may conveniently provide a multiple tunnel junction configuration.

The barrier configuration may be fabricated in a number of different ways. It may include alternate layers of relatively electrically conductive and insulating material, in which the layers collectively provide the relatively wide, low barrier height component of the energy band profile, and the individual insulating layers provide the relatively high barrier components. The alternate layers may comprise polysilicon and silicon nitride respectively although other materials may be used.

Alternatively, the barrier configuration may comprise a Schottky barrier configuration with alternate layers of electrically conductive material and semiconductor material.

The charge storage node may comprise a layer of electrically conductive material between the barrier configuration and the path. The node may comprise a plurality of conductive islands. In an alternative arrangement, the islands are distributed in the barrier configuration and may give rise to the relatively low barrier components of the energy band profile by virtue of their charging energy. The islands may have a diameter of 5 nm or less. They may be arranged in layers separated by insulating material.

The islands may be formed in a number of different ways. They may comprise nano-crystals of semiconductor material. Alternatively they may be formed of metal, for example by sputtering, so as to distribute them in an insulating metallic oxide. Alternatively, the islands may comprise particles deposited from a liquid suspension of metal or semiconductor particles.

The tunnel barrier configuration may be disposed between the path and a control electrode so that by changing the voltage on the control electrode, the amount of charge that tunnels to the charge storage node can be controlled. In another configuration according to the invention, a gate electrode is provided to apply an additional field to the charge barrier configuration in order to control charge tunnelling to the node.

The amount of charge that can be stored at the node may be limited by the Coulomb blockade effect, to a discrete number of electrons.

In use, the tunnel barrier configuration exhibits a blocking voltage range in which charge carrier tunnelling to the node is blocked, and control means may be provided to increase and decrease the blocking voltage range to control the amount of charge stored in the node. The amount of charge that can be stored at the node may be limited to a plurality of discrete electron states. The control means may be operative to raise and lower the blocking voltage range so as to permit only a selected one of the states to exist at the node.

Alternatively, the control means may be operative to vary the width of the voltage blocking range.

The memory device according to the invention is suited to be manufactured as a plurality of memory cells in an array of rows and columns in a common substrate.

Data may be selectively read from each cell individually, and new data may be written to the cell or the stored data may be refreshed. The memory cell array may include sensing lines for detecting current flowing in the paths of respective columns of the memory cells, word lines, data lines for controlling the barrier configurations of the memory cells of a respective column thereof, a precharge circuit for precharging the sensing lines, the sensing lines taking up a charge level dependent upon the stored charge at the charge storage node of a particular one of the cells in a column thereof read in response to a read voltage applied to a corresponding word line, a read/write circuit for transferring the voltage level of the sensing line to the corresponding word line for the column, a data output responsive to the voltage level on the data line for providing output data corresponding to the stored data in the read cell, and data refreshing means for applying a write voltage to the word line of the read cell such that data corresponding to the voltage level on the data line is written back into the previously read cell. The array may also include means for changing the level of voltage on the data line after operation of the read/write circuit in response to input data to be written into the cell, such that the input data is written to the cell.

Peripheral circuits for the array may be formed on a common substrate with the memory cells, and the source and drains of transistors in the peripheral circuits may be formed by the same process steps that are used to form source and drain regions in the cells of the array.

The invention also includes a method of fabricating a memory device which includes a path for charge carriers, a node for storing charge that alters the conductivity of the path, and a tunnel barrier configuration through which charge carriers tunnel in response to a given voltage so as to become stored on the node, the method including forming the tunnel barrier configuration such that it exhibits an energy band profile that comprises a dimensionally relatively wide barrier component with a relatively barrier height, and at least one dimensionally relatively narrow barrier component with a relatively high barrier height.

BRIEF DESCRIPTION OF THE DRAWINGS

In order that the invention may be more fully understood, embodiments thereof will now be described by way of example with reference to the accompanying drawings, in which:

FIG. 17 is a schematic diagram of a second type of memory device in accordance with the invention;

FIGS. 18a and 18b are graphs of the current I through the barrier structure 2 of FIG. 17 as a function of the voltage $V_Y$ applied to terminal Y in the presence ("on" state) of a voltage applied to terminal X and the absence of such a voltage ("off" state);

DETAILED DESCRIPTION

In the following description, the embodiments of memory device according to the invention can be categorised into three different types:

Type 1

Figure 1:
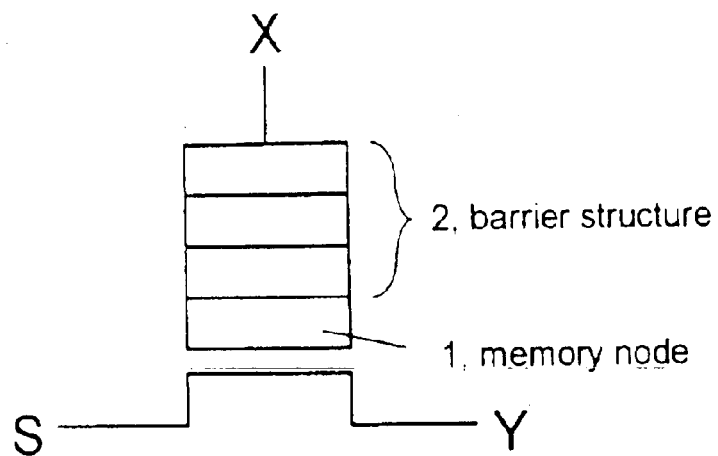
FIG. 1 is a schematic diagram of a first type of memory device in accordance with the invention.

The general configuration of the first type of memory device according to the invention is shown in FIG. 1. A memory node 1 and a barrier structure 2 are integrated within a control electrode of a field effect transistor having source and drain connections S, Y and a control electrode connection X. When information is stored, charge carriers tunnel through the barrier structure 2, to the memory node 1 and the device acts as a storage capacitor, so that the charge is held on the node 1. In order to read information, the conductivity of the source/drain path S, Y is monitored and is changed between relatively high and low conductivity conditions depending on the level of charge stored on the memory node 1.

Figure 2:
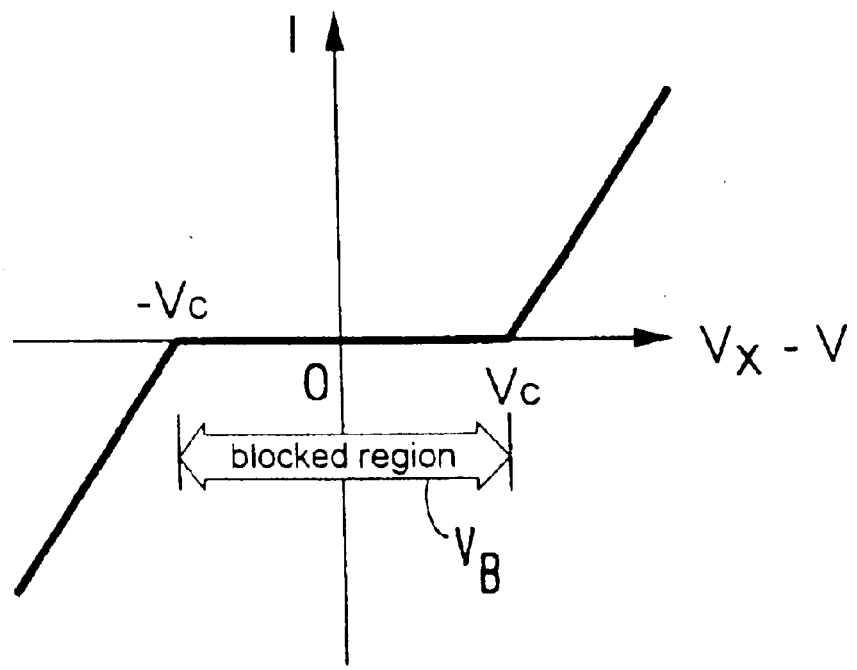
FIG. 2 is a graph of the current:voltage characteristics of the barrier structure 2 shown in FIG. 1.

The current-voltage characteristic of the barrier structure 2 is shown in FIG. 2 where V is the memory node voltage. Electron flow I through the barrier structure from the connection X is strongly suppressed in a blocking region $V_B$ which extends between upper and lower threshold voltages $\pm V_C$. However, outside of this voltage blocking range, charge carriers can tunnel to or from the memory node 1 through the barrier structure, depending on the polarity of a bias voltage $V_X$ applied to the connection X. The barrier structure can be considered as a multiple tunnel junction in which two or more tunnel junctions are connected in series.

Figure 3:
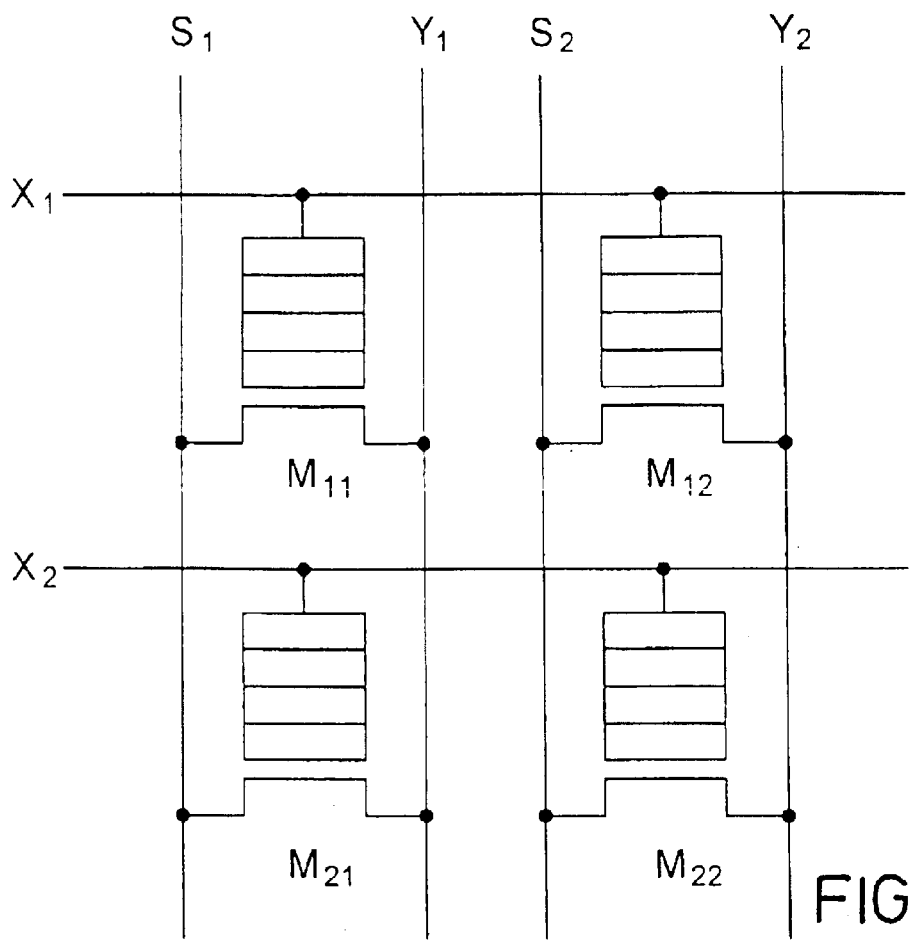
FIG. 3 is a schematic circuit diagram of an array of the memory devices shown in FIG. 1.

The memory device shown in FIG. 1 can be used as a memory cell in an array of such devices, arranged in rows and columns as shown in FIG. 3, with associated word lines $X_1$, $X_2$ etc and bit lines $S_1$, $Y_1$; $S_2$, $Y_2$ etc. The array thus includes memory cells $M_{mn}$, where m and n represent the row and column numbers respectively.

First Embodiment

Figure 4:
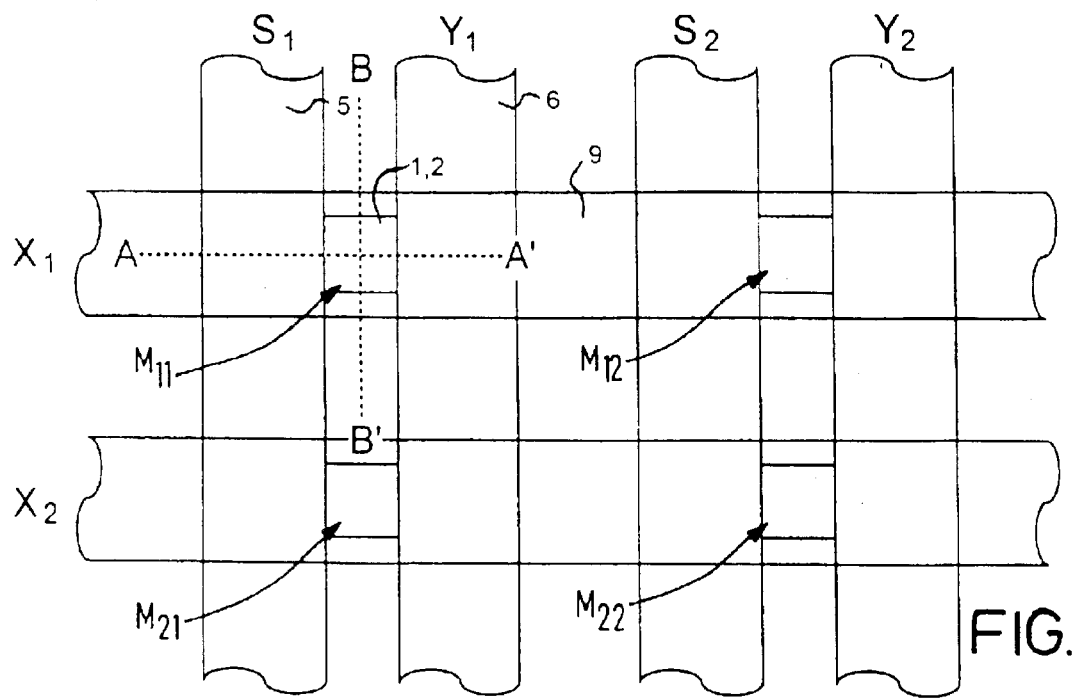
FIG. 4 is a schematic plan view of the structural configuration of the memory array circuit shown in FIG. 3.
Figure 5:
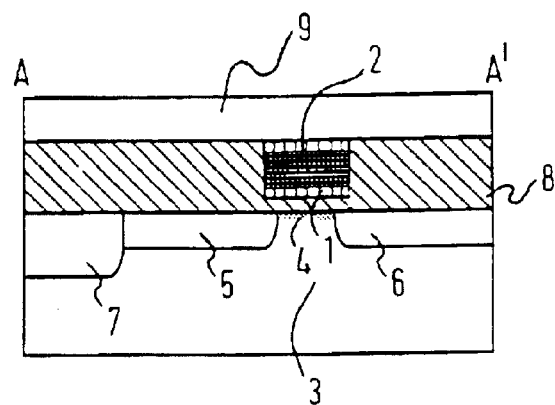
FIG. 5 is a cross sectional view taken along the line A–A' of FIG. 4, through memory cell $M_{11}$.
Figure 6:
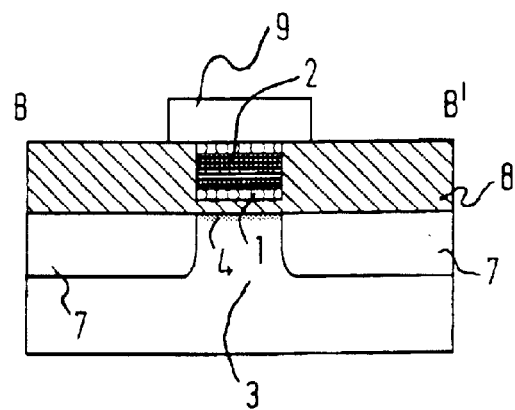
FIG. 6 is a section through the cell $M_{11}$ of FIG. 4, taken along line B–B'.

The structure of a first embodiment of memory cell $M_{mn}$ will now be described with reference to FIGS. 4, 5, and 6 in which FIG. 4 is a plan view of the cell array, and FIGS. 5 and 6 are transverse sections taken along the lines A–A' and B–B' of FIG. 4 respectively of cell $M_{11}$.

Referring to FIG. 5, the device is formed in a substrate 3 which in this example comprises a p-type semiconductor substrate in which a conductive path 4 extends between $n^+$ source and drain regions 5, 6. A $SiO_2$ insulator region 7 isolates the cell from the next cell in the array. The substrate is overlaid by an insulating $SiO_2$ layer 8. The memory node 1 and overlying tunnel barrier configuration 2 are formed in a region surrounded by the layer 8. A conductive control electrode 9 overlies the tunnel barrier configuration 2. The control electrode 9 forms word line $X_1$ which extends along a row of the array. The source and drain regions 5, 6 form bit lines $S_1$, $Y_1$ which extend along a column of the array shown in FIG. 4. It will be understood that other cells in the array have corresponding word and bit lines.

The memory node 1 consists of nanometer scale dots or grains which limit the number of electrons that can be stored by charging through the barrier configuration 2 so as to provide for a uniform field laterally across the node.

Figure 7:
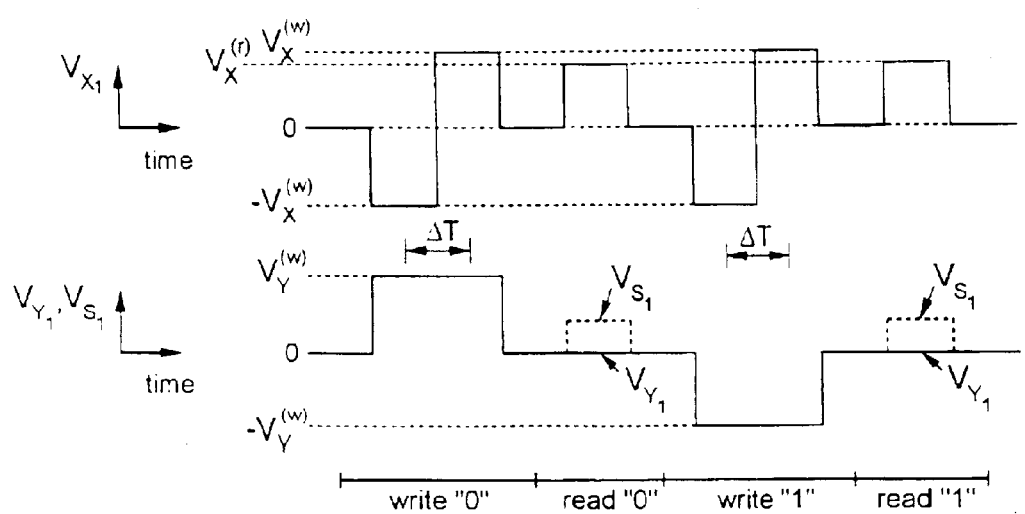
FIG. 7 illustrates a method of reading and writing data to an individual cell of the memory array.

A process of selectively writing and reading data for the memory cell $M_{11}$ will now be described with reference to FIGS. 7 and 8. In this process, the word line $X_1$ and the bit lines $S_1$, $Y_1$ associated with the memory cell $M_{11}$ are activated and the other word and bit lines are grounded. When information is written into $M_{11}$, a voltage pulse waveform with positive peak $V_X^{(w)}$ and negative peak $-V_X^{(w)}$ is applied to the word line $X_1$. When "0" is written, a positive voltage pulse with a height $V_Y^{(w)}$ is applied to the bit lines $Y_1$ and $S_1$. On the other hand, when a "1" is written, a voltage pulse with a peak voltage $-V_Y^{(w)}$ is applied to the bit lines $Y_1$ and $S_1$. A requirement of these pulses is that they must overlap for a time T. In this example, $V_X^{(w)}=1.2V$, $V_Y^{(w)}=1.8V$, and T=10 nsec.

Figures 8A, 8B, 8C, 8D:
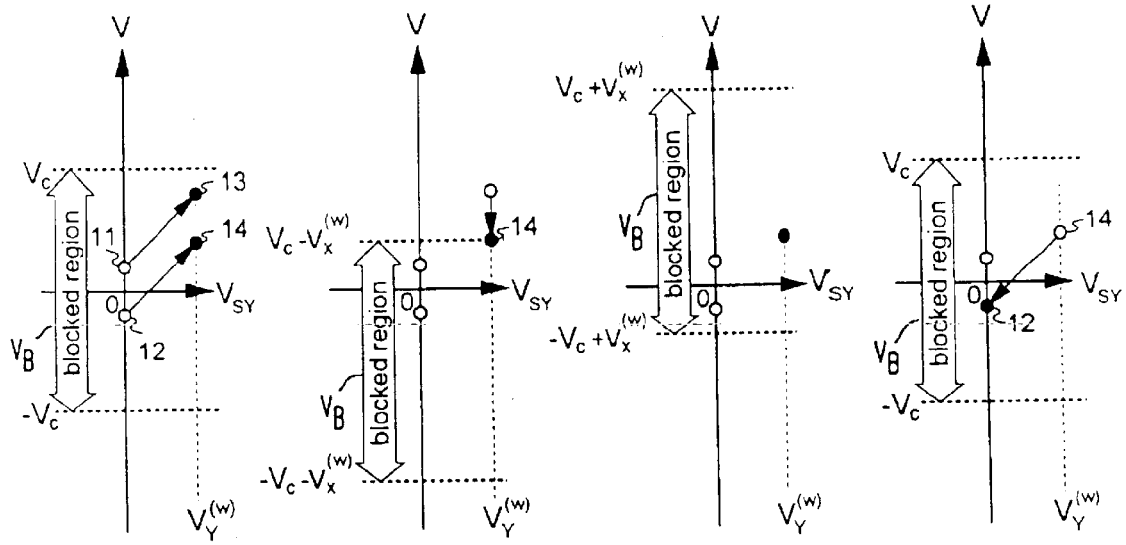
FIG. 8 is a graph of the voltage V of the memory node 1 of the memory device plotted against the voltage $V_{SY}$, at the source and drain of the device during the writing of a binary "0" (FIGS. 8a–d) and the writing of a binary "1" (FIGS. 8e–h)
Figures 8E, 8F, 8G, 8H:
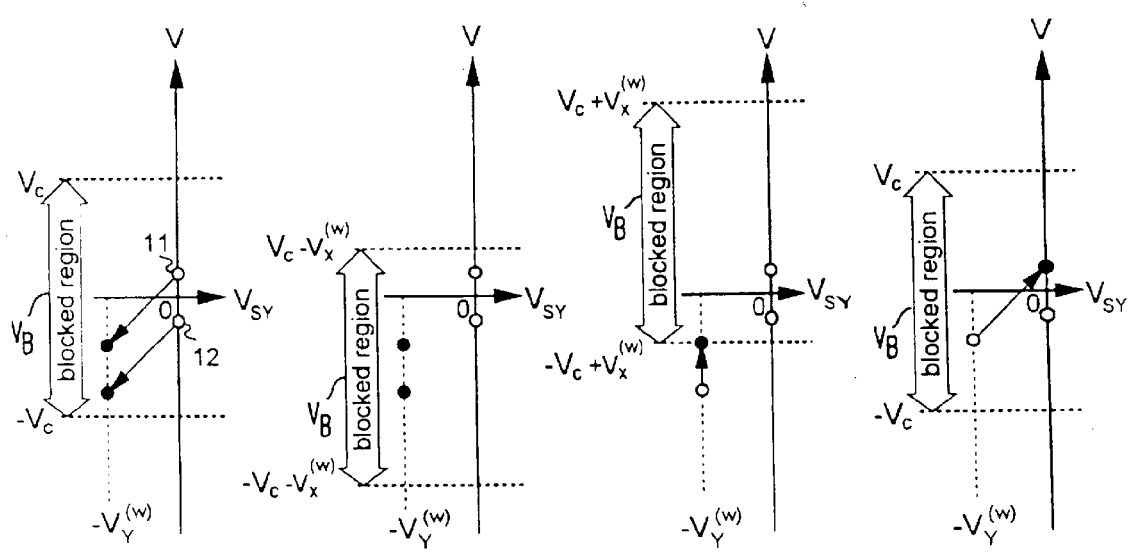

Referring to FIG. 8, the number of electrons that can exist at the memory node 1 is limited by the extent of the voltage blocking region of the tunnel barrier configuration 2. Thus, the voltage at the node cannot exceed $\pm V_C$. In FIG. 8(*a*), a binary data bit "1" is represented by a positively charged state 11 (a shortage of electrons) on the memory node 1, whereas a "0" is represented by a negatively charged state 12 (an excess of electrons) on the node 1. In this example, the memory node voltages in the "1" and "0" states are +0.4V and −0.4V respectively. The process to write a "0" onto the node 1 will now be described with reference to FIGS. 8(*a*)–(*d*) where $V_{SY}=V_S=V_Y$ and black dots represent the final electron state which occurs in each step. When, as shown in FIG. 8(*a*), a positive voltage $V_Y^{(w)}$ (1.8V) is applied on the bit lines $S_1$ and $Y_1$, the two states 11 and 12 move to point 13 (1.6V) and point 14 (0.8V) respectively, along a line of constant electron number on the memory node, such that $$V(C_g/C_\Sigma)V_{SY}+V_0 \qquad (1)$$

where $C_\Sigma$ is the total capacitance on the memory node, $C_g$ is the capacitance between the memory node and the terminals $Y_1$ and $S_1$, and $V_0$ is the memory node voltage when $V_{SY}=0$ ($-C_\Sigma V_0/q$ is the number of excess electrons on the memory node, where q is the elementary charge). In the present embodiment, $C_\Sigma/Cg=1.5$.

Figure 12A:
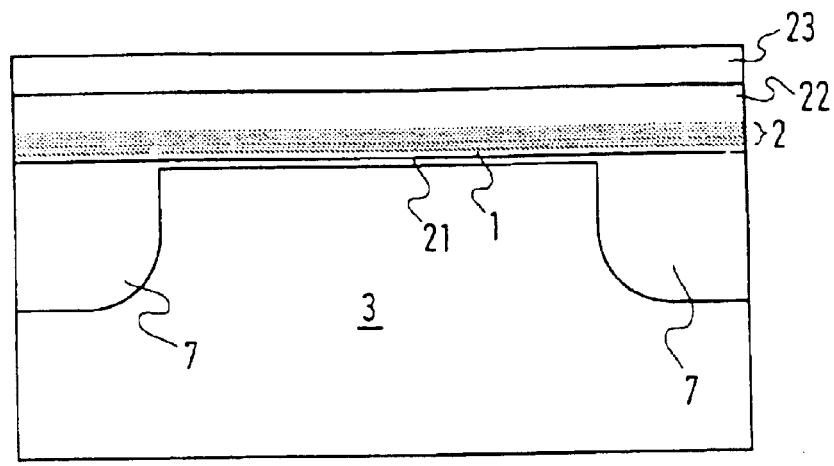
FIGS. 12a–f are cross sectional views corresponding to the line A–A' in FIG. 4, illustrating the various fabrication steps for manufacturing the memory device.
Figure 12B:
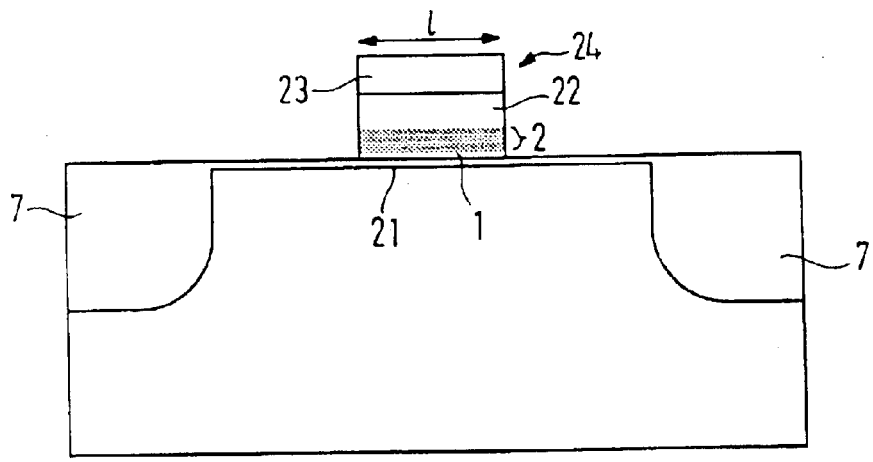

When a negative voltage $-V_X^{(w)}$ (−1.2V) is applied on the word line $X_1$ as shown in FIG. 12*b*, the blocked region $V_B$ shifts as shown, and the state 13 moves to state 14 because the state 13 is outside the blocked region and cannot exist there.

Figure 12C:
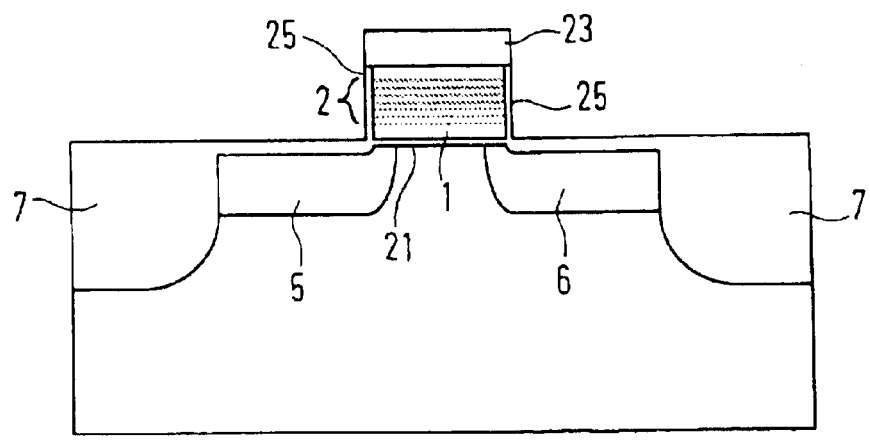
Figure 12D:
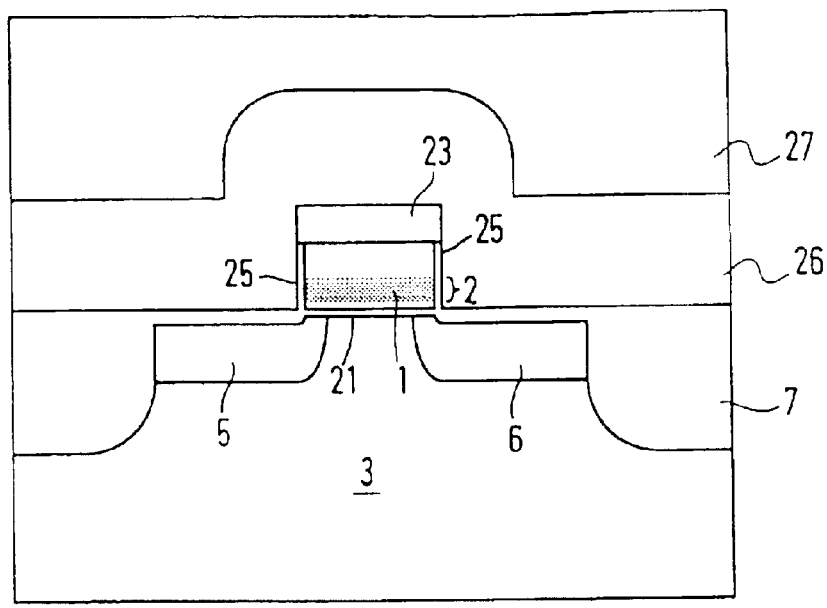

When positive voltage $V_X^{(w)}$ (1.2V) is applied on the word line $X_1$ as shown in FIG. 12*c*, this state is retained. The word line and bit lines are then grounded as shown in FIG. 12*d* and the state 14 moves to the "0" state 12 along a line of constant electron number on the memory node 1.

It is to be noted that any electron state between the "0" and "1" states 11, 12 is refreshed by the process to become a "0" state. The corresponding process for writing a "1" state 11 is shown in FIGS. 8*e*–*h*. In this sequence, any state between the "0" and "1" state is changed to a refreshed "1" state.

It will be seen that the writing process requires simultaneous write waveforms to be applied to the bit lines and word line associated with a particular memory cell. Thus, the memory cells can be addressed individually. During the writing process, the is blocked region is shifted sequentially up and down so as to force the electron states at the node to adopt either a "1" or a "0" value selectively. However, if a write signal is applied to the word line $X_1$ but not to the bit lines $S_1$ and $Y_1$, or write signals are applied to the bit lines but not the word line, no writing will take place and the existing states on the node 1 will be retained.

Figure 9:
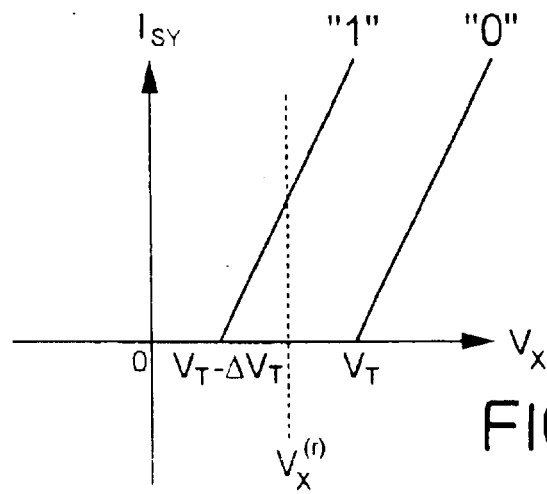
FIG. 9 is a graph of the drain-source current $I_{SY}$ plotted against control gate voltage $V_X$ for a binary "1" and a "0" stored on the memory node 1.

To read the stored information, a positive gate voltage $V_X^{(r)}$ is applied on the word line $X_1$ and the current $I_{SY}$ between $S_1$ and $Y_1$ is detected. As shown in FIG. 9, the threshold voltage of the transistor is given by $V_T$ when the memory node 1 is negatively charged ("0"), and by $V_T-\Delta V_T$ when the memory node is positively charged ("1"). These threshold voltages $V_T$ and $V_T-\Delta V_T$, are positive, so that no electric current flows between S and Y in unselected memory cells ($V_X=0$). The gate voltage $V_X^{(r)}$ at selected word line is chosen between $V_T-V_T$ and $\Delta V_T$. Thus $I_{SY}>0$ for "1" and $I_{SY}=0$ for "0". Thus, a current detector (not shown) can be used to detect the current flowing between the bit lines $S_1$, $Y_1$ (and other corresponding pairs of bit lines in the array) when the gate voltage $V_X^{(r)}$ is applied to the word line $X_1$. In order to read data from the entire memory array, the process is repeated for the other word lines X of the array sequentially. In the present embodiment, $V_X^{(r)}=0.8V$, $V_T-\Delta V_T=0.4V$ and $V_T=1.2V$. In accordance with the invention, the tunnel barrier configuration 2 gives rise to improved storage times and read/write performance. The storage time of the node 1 is determined by the ability of the tunnel barrier configuration 2 to suppress electron flow in the blocked region $V_B$ of the current-voltage characteristic shown in FIG. 2. The storage time $t_s$ is approximately given by $$t_s=t_w \exp(-qV_c/kT) \qquad (2)$$

where k is the Boltzmann constant, T is the absolute temperature, q is the elementary charge, and $t_w$ is the write time. If it is desired, for example, to provide a storage time $t_s$ of ten years and $t_w$ ten nanoseconds, $V_c$ must be larger than 1V for operation at room temperatures. If the single electron charging effect were to be used, this would require the barrier structure 2 to be formed of metallic particles of a size of less than 1 nm which cannot be readily achieved with present day fabrication technologies.

A method by which an enhanced blocking voltage $V_c$ can be achieved, is to use a band bending effect for the charge barrier configuration 2, which has been discussed in respect of a multiple tunnel junction per se by K. Nakazato and H. Ahmed in Applied Physics Letters, 5 Jun. 1995, Vol. 66, No. 23, pp. 3170–3172. The characteristics required for the tunnel junction for the storing and write cycles can be considered separately. For the storing cycle, the height and width of the tunnel junction can be denoted by $\phi_s$ and $d_s$ respectively, and $\phi_w$ and $d_w$ for the write cycle. To retain the stored information for longer than 10 years, the barrier height $\phi_s$ should be higher than 1.8 eV to suppress thermally activated Pool-Frenkel emission current and the tunnel barrier thickness $d_s$ should be thicker than 8 nm$\times\{\phi_s(eV)\}^{-1/2}$ in order to control tunnel leakage current. However to obtain a short write time of for example 10 nanoseconds, the width $d_w$ of the tunnel barrier should be less than 2 nm$\times\{(\phi_w(eV)\}^{-1/2}$ where $\phi_w$ is the barrier height for write cycle.

Figure 10:
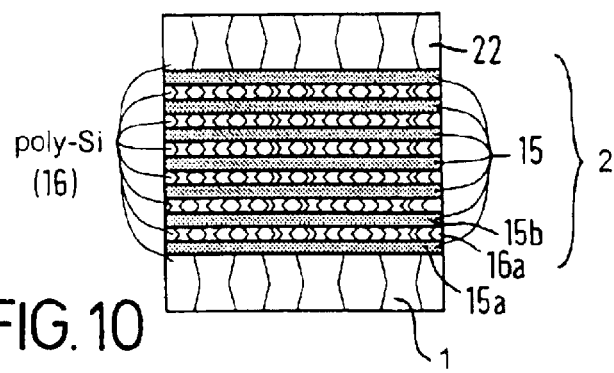
FIG. 10 is a more detailed sectional view of the barrier structure 2 of the memory device.

A barrier configuration 2 which can satisfy these criteria is shown in FIG. 10 and comprises a multiple tunnel barrier consisting of layers 15, 16 of insulating and non-insulating material respectively. In this example, the insulating layers 15 comprise 1–3 nm thickness $Si_3N_4$ and the non-insulating layers 16 comprise polysilicon of 3–10 nm thickness.

The resulting conduction energy band diagram for the barrier configuration 2 shown in FIG. 10, is illustrated in FIG. 11 and comprises a first relatively wide barrier component 17, with a width $B_{w1}$ corresponding to the combined width of all of the layers 15, 16 that make up the barrier configuration 2. Additionally, the insulating layers 15 each give rise to a respective relatively narrow barrier component 18a, b etc each having a width $B_{w2}$ spaced apart from one another by virtue of the depletion regions that in use are formed in the polysilicon layers 16. The relatively wide barrier component 17 has a relatively low barrier height $B_{h1}$ whereas the barrier components 18a, b etc provide much higher barriers $B_{h2a}$, $B_{h2b}$.

The two components 17,18 of the barrier perform different roles. The narrow and high barrier components 18 act as tunnel barriers which suppress co-tunnelling effects, namely spontaneous tunnelling through two or more tunnel barriers by a quantum mechanical effect, so that electrons move through only one barrier 18 at a time and stay for a period of time in the region between them. During the stay, the electrons are scattered inelastically towards a local equilibrium state governed by the energy of the wide barrier component 17. Thus, electron transport is strongly affected by the wide barrier component 17. The width and height of the high, narrow barrier components 18 cannot be changed by external biases because they are determined by the materials which make up the barrier configuration 2. However, the wide, low barrier 17 component can be modulated by the external biases.

Figure 11A:
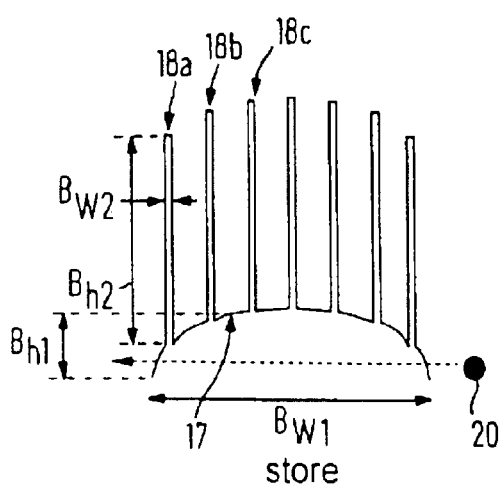
FIG. 11a illustrates the conduction energy band diagram for the barrier configuration 2 when charge carriers are stored on the memory node 1.
Figure 11B:
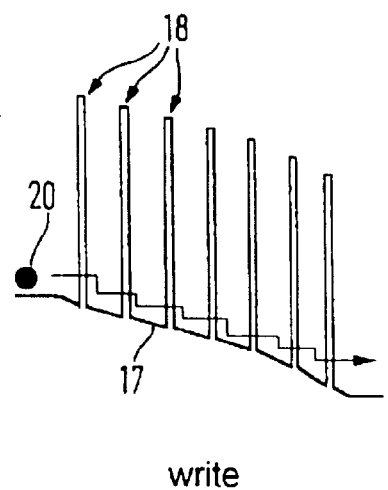
FIG. 11b illustrates a corresponding energy band diagram when charge carriers are written onto the node 1 by tunnelling from the control electrode terminal X.

FIG. 11a illustrates the band diagram in the absence of an applied voltage $V_X$. It will be seen that when no voltage is applied to the control electrode 9, electron 20 on the charge storage node 1 needs to tunnel through the entire width of the relatively wide barrier component 17 if leakage from the node 1 is to occur, with the result that charge leakage is strongly inhibited. However, when a voltage is applied to the electrode 9 the conduction energy band diagram for the barrier 2 changes to the configuration shown in FIG. 11b from which it can be seen that the applied voltage causes the relatively wide barrier component 17 to form a downwardly inclined slope towards the charge storage node 1 with the result that an electron 20 needs only to tunnel through the relatively narrow barrier components 18 in order to reach the storage node. Thus, the barrier configuration provides a relatively wide barrier component 17 for long term storage of the electrons on the node 1, without the requirement for extremely high voltages applied to the electrode 9 in order to cause electrons to tunnel to the node 1 during the write process.

In the layers 16, the grains of polysilicon have a diameter which is nearly as large as the thickness dimension. The grain size in the memory node 1 can be larger than that of the layers 16 with the result that the electrons can be stored stably on the memory node 1 to provide reliable operation. In the arrangement of FIG. 10, the memory node 1 has a thickness of 5–30 nm and is formed of polysilicon. In a modification, the node 1 may be doped in order to improve stability of the electron states at the node. From the foregoing, it will be seen that when information is stored, the polysilicon layers 17 form depletion regions and thus increase $d_s$ whereas in the write process, the layers 16 do not act as barriers and instead, the arrangement provides a potential gradient which accelerates electrons towards the node 1 from the electrode 9, which promotes rapid writing of electrons onto the node.

An example of fabrication of the device will now be described in more detail with reference to FIG. 12. A p-type silicon wafer with a resistivity of 10 Ωcm is used for the substrate 3. Initially, the isolation region 7 is formed, of insulating $SiO_2$ with a thickness of 500 nm. After forming the isolation region 7, a gate oxide film 21 of thickness 10 nm is grown by thermal oxidisation on the top of the p-type silicon substrate 3. The layer which is to form the memory node 1 is then deposited. The layer 1 comprises n-type Si deposited to a thickness of 10 nm having its surface converted to silicon nitride in an atmosphere of $NH_3$ at a temperature of 900° C. The thickness of the resulting silicon nitride is self limited to 2 nm. This corresponds to the nitride layer 15a shown in FIG. 10. Then, a layer of non-doped silicon is deposited to a thickness of 5 nm so as to form an overlying layer 16a FIG. 10), which is then subject to nitridation to form the next 2 nm thick silicon nitride layer 15b. The process is repeated a number of times in order to build up the barrier structure 2.

Then an n-type doped silicon film 22 of thickness 20 nm is deposited over the barrier structure layers 2. A $SiO_2$ film 23 is deposited on the film 22 to a thickness of 20 nm, by a chemical vapour deposition (CVD) method.

The various layers of silicon film are deposited in an amorphous state but are converted to polycrystalline silicon during the nitridation and the densifying process of the CVD deposited $SiO_2$ layer 23. The top $SiO_2$ film 23 is then patterned by conventional lithography techniques and reactive ion etching in an atmosphere of $CHF_3$ and argon gas.

Then using the patterned $SiO_2$ layer 23 as a mask, the polysilicon and silicon nitride layers 22, 2 and 1 are etched by reactive ion etching using $CF_4$ in order to produce a gate configuration 24 as shown in FIG. 12b. The gate configuration 24 typically has a length 1 of 0.15 μm.

The wafer is then oxidised to form an outer layer 25 of 30 nm thermal $SiO_2$ as shown in FIG. 12c. Then, the source and drain regions 5, 6 are formed by ion implantation with arsenic ions.

Figure 12E:
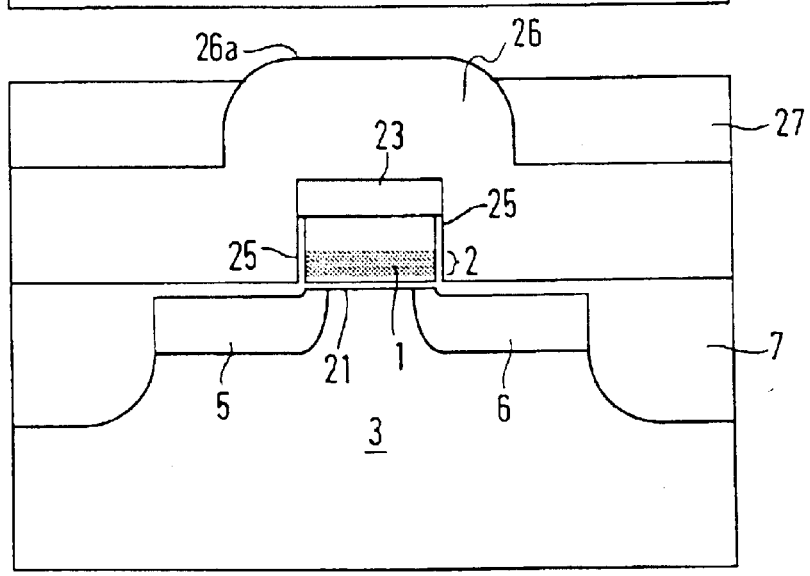

Then, as shown in FIG. 12d, a 100 nm $SiO_2$ film 26 is deposited, which is covered by a layer of optical photoresist 27 that is applied in sufficient thickness to obtain a flat upper surface, of thickness 1500 nm in this example. The photoresist 27 is then etched back until the top of the $SiO_2$ layer 26 protrudes through the surface. The etching is carried out by a sputtering method in an $O_2$ atmosphere. The resulting configuration is shown in FIG. 12e.

Figure 12F:
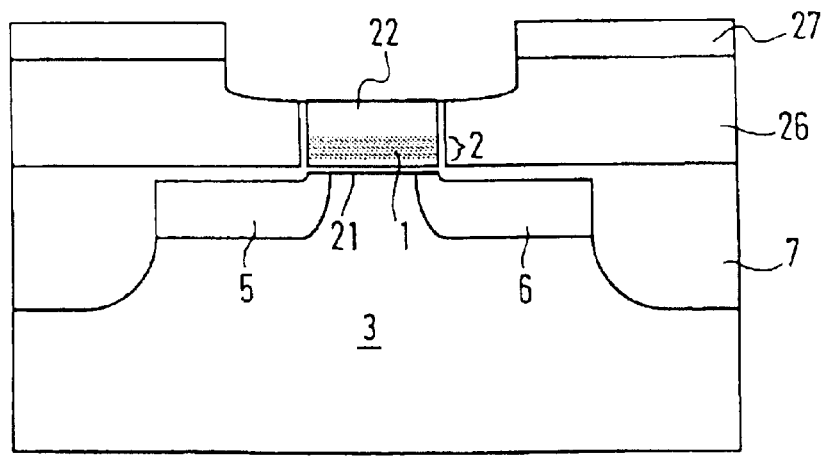

The top 26a of the $SiO_2$ film 26 is removed by reactive ion etching in an atmosphere of $WF_6$ gas until the top of the polysilicon film 22 is exposed, as shown in FIG. 12f.

After removal of the optical photoresist 27, metal is deposited on the resulting surface and patterned by conventional lithography techniques in order to provide the control electrode 9 which forms the word line $X_1$ described previously.

It will be appreciated that the memory device may be modified in a number of ways. For example, the thickness of the electrically conductive layers 15 may be different from the described value of 5 nm and generally, a thickness of 10 nm or less would be satisfactory. The thickness of the insulating layers 16 may be modified from the previously described value of 2 nm, so as to be in the range of 3 nm or less, so as to produce satisfactory narrow, high barrier components 18, although the described fabrication process results in a tight control of the thickness of each layer 16 so that it becomes of the order of 2 nm. Also, the number of sets of the layers 15, 16 may be varied from the described example of seven, as long as there are sufficient numbers to produce a satisfactory wide, narrow barrier component 17 across the barrier configuration 2.

Second Embodiment

Figure 13:
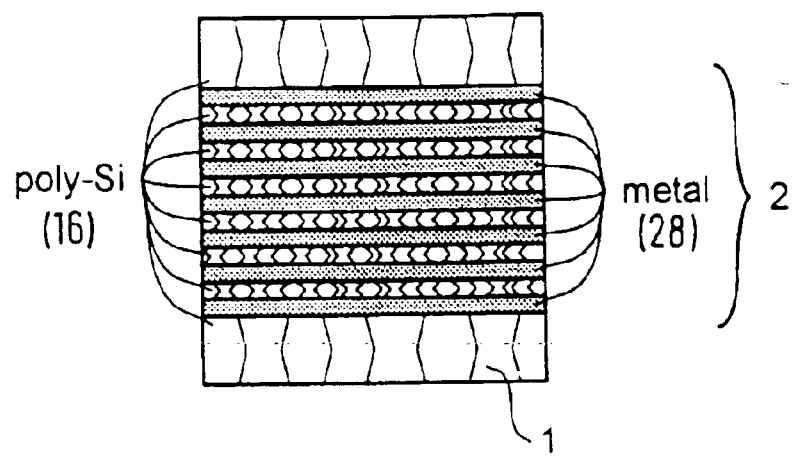
FIG. 13 is a schematic cross section of a Schottky barrier configuration that can alternatively be used in the memory device.

In a modification, the barrier structure 2 shown in FIG. 10 can be replaced by a Schottky barrier configuration as shown in FIG. 13. In this case, instead of using insulating silicon nitride layers 15, metallic layers 28 are used so as to provide a multiple configuration of Schottky diodes one overlying the other. The metal layers 28 may be formed of W or may comprise silicide films such as $CoSi_2$, formed between the non-doped polycrystalline film 16.

Further embodiments of memory device according to the invention will now be described in which the tunnel barrier configuration 2 consists of nanometer-scale islands distributed in a matrix of electrically insulating material. In the following examples, the nano-scale islands have a diameter of 5 nm or less and are separated by nanometer scale thicknesses of electrically insulating material in the matrix, for example 3 nm or less, which gives rise to the narrow, high barrier components of the tunnel barrier configuration. The charge storage node may be formed by the conductive islands, so as to be distributed throughout the barrier configuration, rather than being a separate layer 1, as previously described. Several different fabrication processes can be used to provide the resulting multiple tunnel barrier configuration, as will now be described.

Third Embodiment

Figure 14:
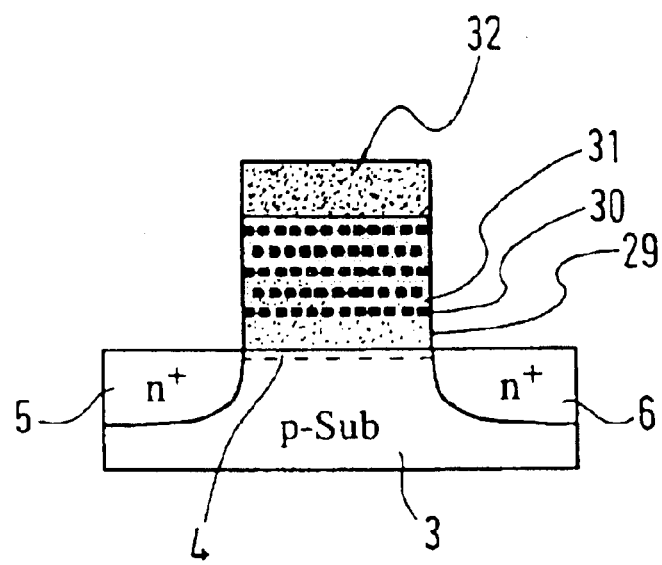
FIG. 14 is a schematic cross section of an alternative barrier structure that includes nanometer scale conductive islands, for a third embodiment of memory device in accordance with the invention.

FIG. 14 illustrates a schematic cross section through another embodiment of memory device in accordance with the invention. In this embodiment, the memory node 1 and the barrier structure 2 are realised by a composite of nanoscale crystals which are distributed in a surrounding $SiO_2$ matrix. Referring to FIG. 14, the substrate 3 is provided with source and drain regions 5, 6, with a path 4 between them. A gate oxide layer 29 overlies the path 4 and has a thickness of 5 nm, formed by a thermal oxidation process on the substrate. Subsequently, a layer of silicon of thickness 6 nm is deposited by electron beam vaporisation or by CVD, which is then subjected to rapid thermal oxidation and crystallisation. This process is described in E. H. Nicollian and R. Tsu, J. Appl. Phys. vol. 74, 1993, pp. 4020–4025, and M. Fukuda, K. Nakagawa, S. Miyazaki, and M. Hirose, Extended abstracts of 1996 International Conference on Solid State Devices and Materials, Yokohama, 1996, pp. 175–178. This yields islands in the form of Si nano-crystals with an average diameter of 3 nm configured in a layer 30 with a tunnelling oxide layer 31 of 2 nm thickness overlying the layer 30. The self-capacitance of the 3 nm Si crystals gives a charging energy of about 100 meV, which is enough to limit by Coulomb blockade the electron number inside each nano-crystal, at room temperature. The deposition of layer 29 followed by the rapid thermal oxidisation and crystallisation process are repeated a number of times in order to build up a sufficiently thick composite layer. In this embodiment, the process was repeated five times in order to provide a composite layer thickness of 20 nm, containing five nano-crystal layers 30 within its thickness. Thereafter, a contact layer of n-type silicon 32 is formed on the top surface. It will be appreciated that the resulting gate structure can be incorporated into the memory device fabrication process previously described with reference to FIG. 12. However, it will be understood that the memory node 1 is no longer provided as a separate layer but instead, the nano-crystals formed in each layer 30 provide sites for electron storage distributed in the insulating oxide layers 29, 31.

Fourth Embodiment

FIG. 15 illustrates process steps for forming another embodiment of the memory device. In this embodiment, the composite of silicon nano-crystals and surrounding $SiO_2$ layers are formed by using porous Si films. Referring to FIG. 15a, a porous Si film 33 of 20 nm thickness is formed by an anodic oxidisation of p-type Si. The anodisation is performed in a 25% aqueous hydrofluoric acid solution, diluted by ethanol, with a DC anodic current of 10 $mA/cm^2$ for five seconds. This results in the formation of a composite film containing 4~5 nm nano-crystalline Si embedded in a $SiO_2$ matrix. This method is known per se and described in more detail in Y. Kanemitsu, et al Phys. Rev. vol. B48, 1993, p 2827.

Figure 15A:
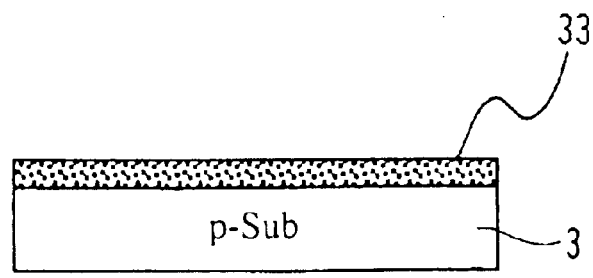
FIG. 15 illustrates a series of fabrication steps for producing a memory device in accordance with the invention in which nanometer scale silicon crystals are distributed throughout a $SiO_2$.
Figure 15B:
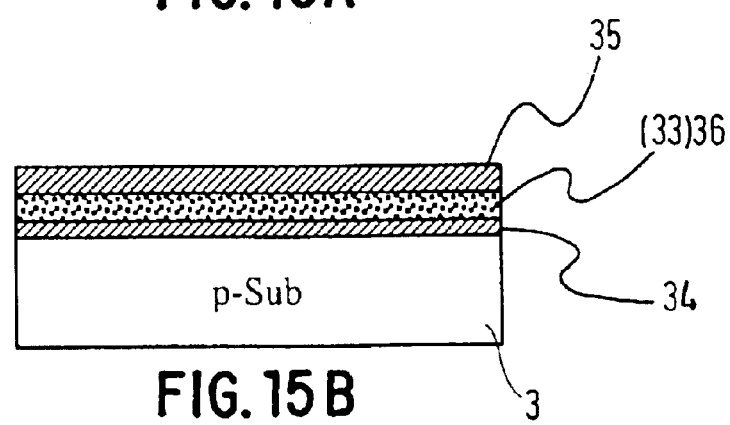
Figure 15C:
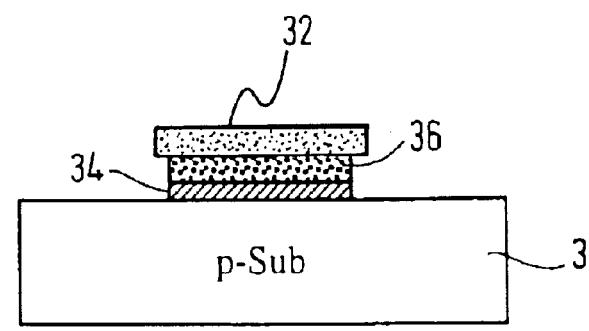
Figure 15D:
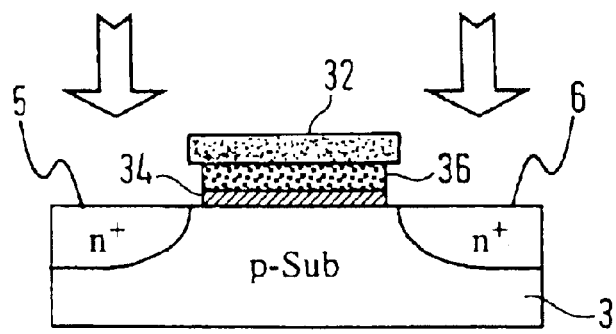

Then, the porous silicon film 33 is thermally oxidised to form a gate oxide film 34 of 5 nm thickness together with a top oxide layer 35 of about 7 nm thickness, as shown in FIG. 15b. This process also results in annealing, which shrinks the diameter of each of the nano-crystals in the porous Si film, as well as the thickness of the porous layer 33 itself. After the annealing process, the porous Si layer 33 becomes 14~16 nm in thickness, and the average particle diameter decreases down to about 3 nm. The corresponding charging energy for the nano-crystalline silicon particles is about 100 meV which, as previously explained, results in a limitation on the number of electrons which can enter the node, due to Coulomb blockade. The resulting film is referenced 36 in FIG. 15b and contains approximately 3 to 4 nano-crystalline particles across its thickness thereby providing a multiple tunnel junction (MTJ) when considering electron transport vertically through the layer.

Thereafter, the top oxide layer 35 is removed and a gate 32 of polysilicon material is deposited as described previously. Using the polysilicon gate 32 as a mask, the composite film 36 and the underlying gate oxide 34 are removed by conventional etching techniques and thereafter, the source and drain regions 5, 6 are implanted in the manner previously described with reference to FIG. 12. This formation method has the advantage over the method described with reference to FIG. 14 in that the multiple tunnel junction is formed by a single anodisation process, reducing the number of Si deposition and oxidisation steps that are required.

Fifth Embodiment

Composite materials of nano-crystals and the surrounding matrix can be formed in other ways, using different materials. One example is described by E. Bar-Sadeh et al in Physical Review vol. B50, No. 12, 1994, pp 8961–8964. In this method, a layer of Au particles in a $Al_2O_3$ matrix can be used to replace the porous silicon layer shown in FIG. 15. A 30 nm thick composite film of Au and $Al_2O_3$ can be formed by co-sputtering gold and aluminium onto silicon oxide layer of thickness 5 nm that has been formed by thermal oxidisation of the substrate 3. The subsequent device fabrication is the same as that of the fourth embodiment. The sputtering condition for the composite film formation is chosen so as to realise a gold volume fraction of 0.4. In this condition, isolated Au particles are obtained in the composite film which are of diameters of the order of 3~5 nm. Therefore, the 30 nm film contains 5~10 Au particles across its thickness forming a vertical MTJ. It will be appreciated that this can be used as a substitute for the porous silicon layer described with reference to FIG. 15.

Composite films of other noble metals such as Ag, Pt, with some other metal oxide matrix such as $SiO_2$ or $Cr_2P_3$ can be formed by this co-sputtering method.

A metal island-oxide matrix composite film can also be formed by thermal decomposition of precursor metal oxides. For example, gold oxide, which is a precursor metal oxide, can be generated by reactive sputtering of an Au—Si alloy target in an oxygen plasma, as described in L. Maya et al in J. Vac. Sci. Technol. Vol. B14, 1996, pp. 15–21.

Sixth Embodiment

FIG. 16 shows a method of forming composite nanocrystals and insulating tunnel barriers by a chemical deposition method from a colloidal solution. Referring to FIG. 16a, an oxide layer 21 of thickness 5 nm is formed by a thermal oxidisation process on a p-type Si substrate 3. Then, a monolayer 37 of octadecyltrichlorosilane (OTS) is produced on the surface of $SiO_2$ layer 21. As described in more detail in M. J. Lercel, et al., J. Vac. Sci. Technol vol. B11, 1993, p.2823–2828. In more detail, the substrate 3 with the $SiO_2$ layer 21, was immersed in a 1 mM hexadecane solution of OTS for more than 12 hours. This resulted in a spontaneous formation of the OTS monolayer 37. OTS molecules can be removed from the $SiO_2$ surface 21 by irradiation with a 60 kV electron beam. In this way, window patterns in the OTS are generated on the monolayer 37 by means of conventional electron beam lithography. After formation of a window in the OTS, the substrate was immersed in a 1% aqueous solution of hydrofluoric acid for 30 seconds, rinsing out the residues of the electron-beam irradiated OTS, leaving a window 38. The edge region of the window is shown in an enlarged view, within hatched outline 39. An example of an OTS molecule 40 is shown. It consists of an alkane chain having a siloxane bond at one end and a methyl group at the other. As shown in the enlarged area 39, the molecules 40 form a siloxane bond with the $SiO_2$ layer 21 and form densely packed covalently bonded network. The methyl group at the upper end is essentially inert and hence is highly resistive to chemical attack during substrate processing.

Figure 16A:
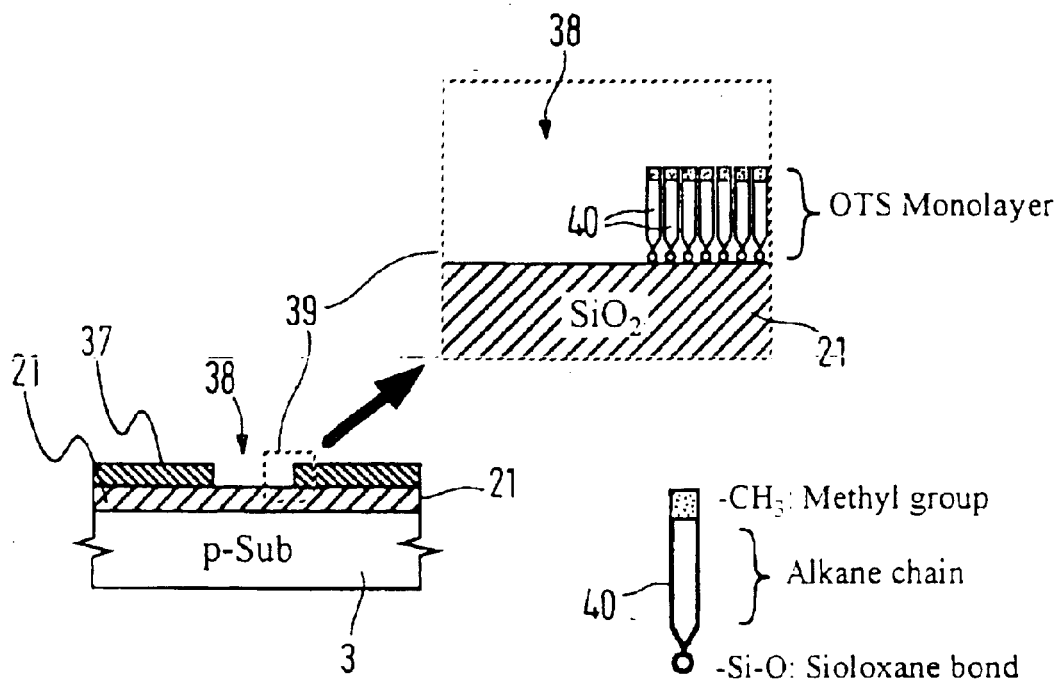
FIGS. 16a–f illustrate process steps for forming an alternative embodiment in which the barrier configuration includes nanometer scale gold particles deposited from a colloidal solution.
Figure 16B:
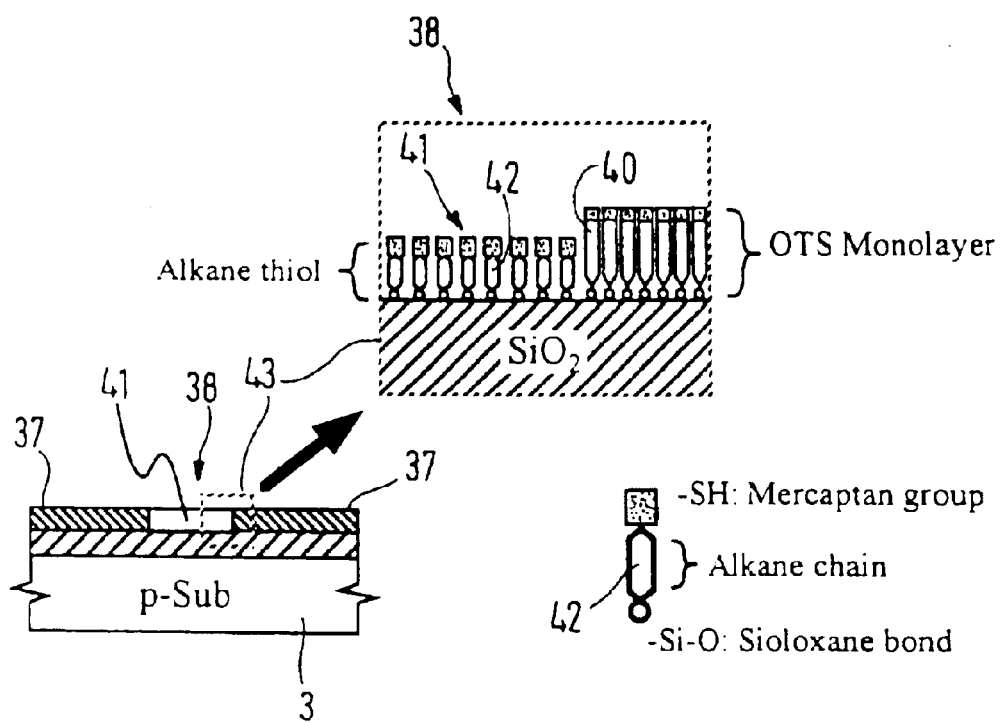
Figure 16C:
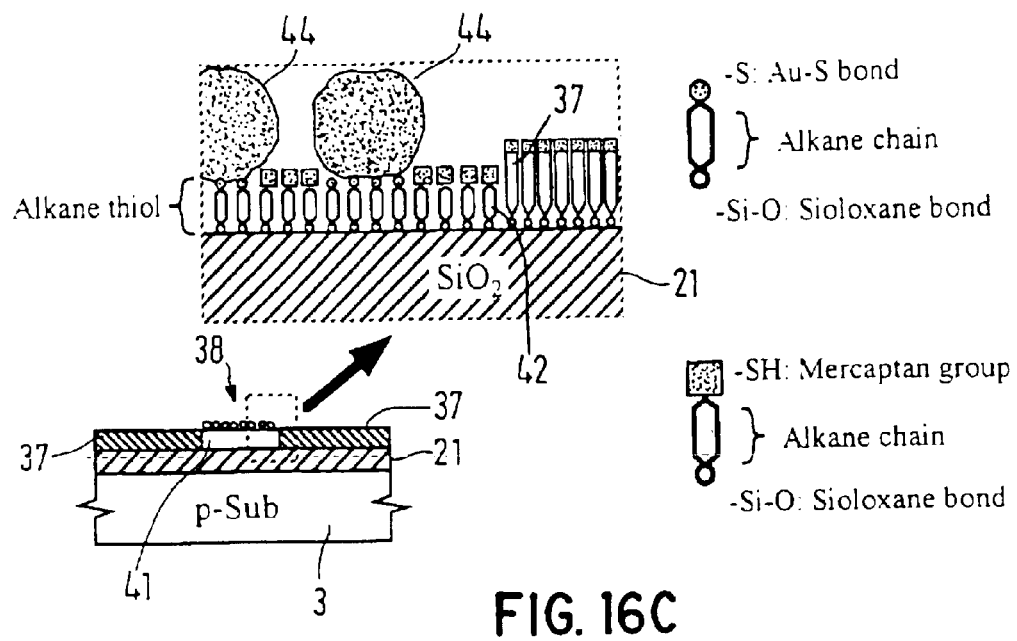

Subsequently, the substrate with its patterned OTS monolayer 37, is placed in a dilute (0.05%) dry toluene solution of (3-Mercatopropyl trimethoxysilane in a reflux condition (i.e. heated approximately 110° C.) for ten minutes. Afterwards, thee substrate was placed in an oven at 105° C. for 30 minutes to cure the siloxane bonds. The result is shown in FIG. 16b. The procedure yields an alkane thiol monolayer 41 on the $SiO_2$ layer 21 in the region of the window 38. The structure of the individual molecules 42 which make up the alkane thiol monolayer consist of a siloxane bond at one end of an alkane chain with a mercaptan group at the other. This process is described in more detail in A. Doron, et al., Langmuir, Vol. 11, 1995, pp. 1313–1317. The OTS molecules remain unaffected outside of the window region 38. The alignment of the molecules 37, 42 can be seen more clearly from the enlarged view of the edge of the window shown within hatched outline 43. In principle, this surface modification can be carried out with other alkane thiols terminated at one end by an alkoxy silane (($CH_3O)_3$Si—, or ($C_2H_5O)_3$Si—).

The substrate is then immersed in a gold colloid solution for at least five hours at room temperature with the result that a monolayer of colloidal gold particles 44 becomes attached to the window region 38. This occurs only in the window region where the surface is terminated with mercaptan groups (—SH) because of the strong affinity of sulfur to gold. The average diameter of the gold colloid particles is 2 nm.

It is well known that colloidal particles of gold can be prepared chemically, which have average diameters in the range of 2–5 nm with a well defined size distribution, typically with a standard deviation of 10%. Such nano particles deposit on the mercaptan group terminated surface forming covalent bonds between the sulfur atom on the substrate and the gold atom on the gold colloid particle surface. The particle deposition automatically stops when the layer approximates to a monolayer, because electrostatic forces due to the surface charge of the gold particles, which are provided by the ionisation of adsorbates on the gold colloid particles prevent another colloid particle from sitting on top of or very close to an already deposited particle on the surface of the substrate. For a more detailed discussion, reference is directed to our EP 96300779.4 filed on 6 Feb. 1996. Colloidal suspensions of such particles can be purchased commercially, with predetermined mean particle sizes and diameter range distributions, from Nanoprobes Inc, 25E Loop Road Ste 124, Stony Brook N.Y. 11790-3350 USA. The particles are supplied in an aqueous suspension. Adsorbed citrate ions give a negative charge to the Au particles.

Figure 16D:
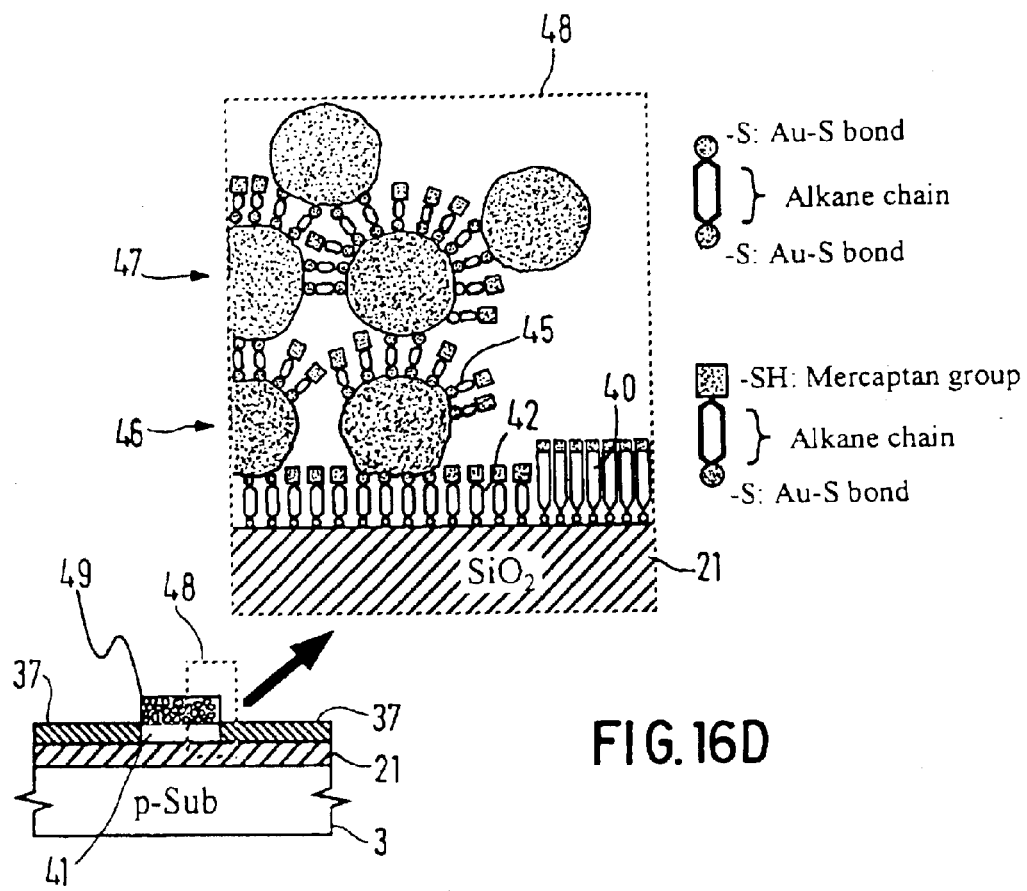

Then, the substrate is immersed in a 5 nM ethanolic solution of dithiol (namely 1,6-hexanedithiol) after the previously described deposition of gold particles from the colloid solution. One of the two sulfur atoms in the dithiol forms Au—S bonds with the gold colloid surface, replacing the surface adsorbates of the gold particles with the dithiols, while the other end of the sulfur atom in the dithiol is oriented away from the gold surface in the form of a free mercaptan group. This arrangement is shown in FIG. 16d, with the dithiol molecules being referenced 45. Consequently, the gold particle surface is converted to a mercaptan-group coated surface which is capable of receiving a further layer of gold particles.

Next, the dithiol treated surface is immersed in gold colloid solution again to deposit a further layer. This process is repeated five times in order to build up five layers of 2 nm gold particles which are connected by alkane chains of dithiol. Two of the gold layers, 46, 47 are shown in the enlarged section 48 in FIG. 16d. The resulting five layer gold structure is referenced 49 in FIG. 16d, which has a thickness of the order of 10 nm.

Figure 16E:
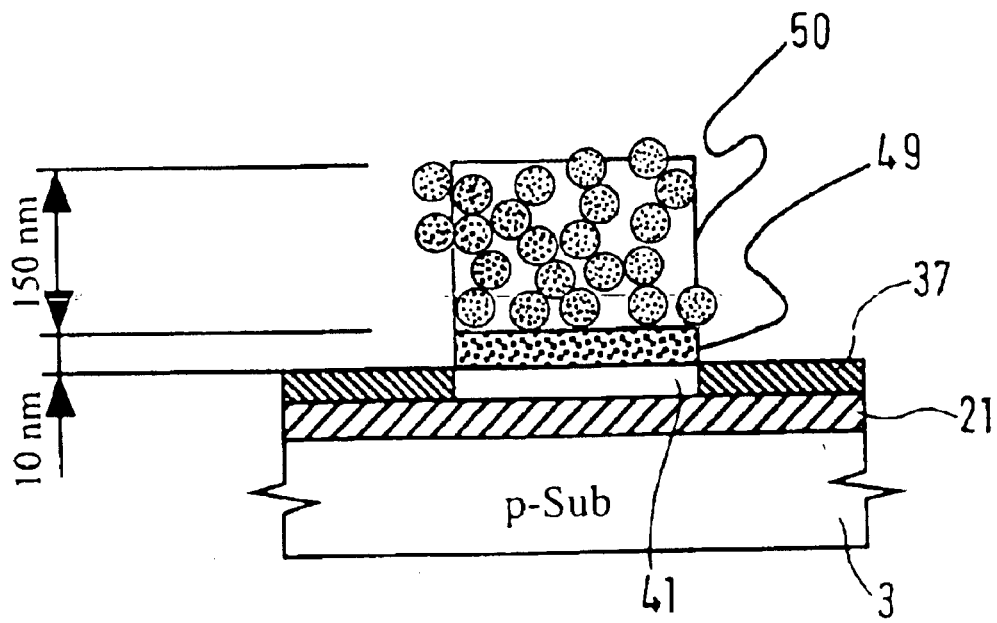
Figure 16F:
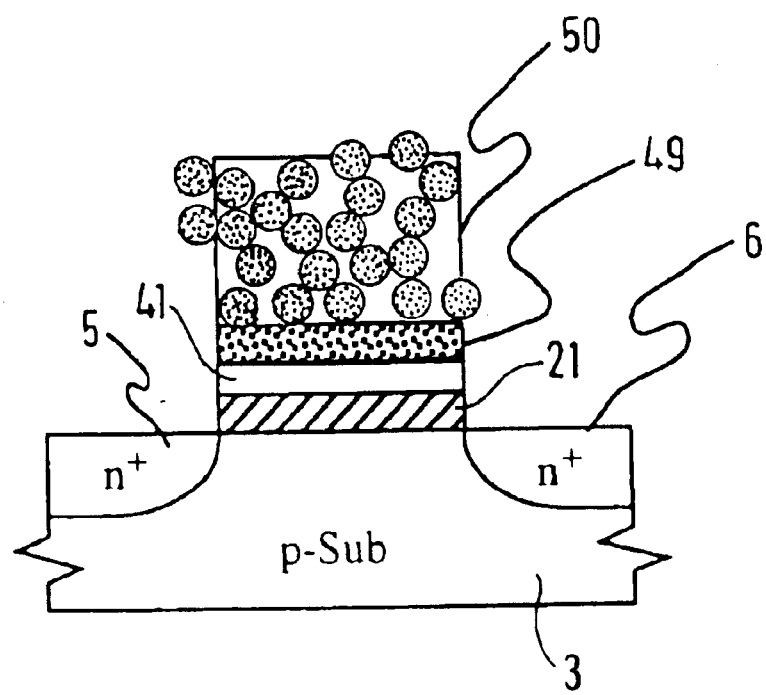

Thereafter, as shown in FIG. 16e, the gold deposition process is repeated five more times with a gold colloid solution which contains gold particles of a larger diameter e.g. 40 nm. This procedure forms a 150 nm thick 40 nm gold particle composite layer 50 on top of the layer 49. Because the particles that form the layer 50 are of a much larger diameter, they exhibit a neglibly small charging energy of the order 1 meV, and consequently, electron conduction through the composite layer 50 exhibits an ohmic character, unlike the smaller particles that form the layer 49, which exhibit conduction characteristics dominated by the Coulomb blockade effect. Therefore, the large particle gold composite 50 works as an ordinary metal layer and hence performs the function of a gate in the same manner as for example the polysilicon gate 22 described in the previous embodiments.

Thereafter, the gold composite layer 50 is used as a mask for dry etching the OTS layer 37 and the gate oxide layer 21 so as to permit the source and drain regions 5, 6 to be implanted in the substrate 3 by conventional ion beam techniques.

Type 2

The general configuration of another type of memory device in accordance with the invention is shown in FIG. 17. The device is similar to that shown in FIG. 1 and like parts are marked with the same reference numbers. The device of FIG. 17 additionally includes a control gate 51 which allows a field to be selectively applied to the barrier configuration 2 so as to alter its tunnel barrier characteristics. Thus, when a voltage is applied to terminal Y, by changing the voltage at terminal X, the field on the gate 51 can be varied and as a result, the field causes the tunnel barrier characteristics of the barrier 2 to be changed. The effect of the field applied by gate 51 can be seen from the graphs of FIG. 18. The voltage on gate 51 can be used to switch the device between "on" and "off" states illustrated in FIG. 18a and 18b respectively. The voltage applied to gate 51 alters the width of the blocking voltage $V_B$. As shown in FIG. 18a, when a "on" voltage $V_X$ is applied to gate 51, the blocking voltage is relatively small and in some circumstances does not exist. In FIG. 18a, the blocking voltage $V_B$ extends from $-V_{CL}$ to $+V_{CL}$ whereas for the other "off" voltage on gate 51, the blocking region assumes its wider range extending from $-V_{CH}$ to $+V_{CH}$. Thus, when the device is switched to the "on" state charge can tunnel onto the memory node 1 and be stored during the "off" state. During the "off" state, a bias voltage may be applied to the gate 51 in order to enhance $V_{CH}$ substantially, as described in K. Nakazato and H. Ahmed in Applied Physics Letters, 5 Jun. 1995, Vol.66, No.23, pp. 3170–3172. The field produced by the voltage $V_X$ applied to the word line 51 is applied to the tunnel barrier configuration 2, so as to squeeze non-conduction region as can be seen by comparing FIG. 18a with 18b.

Figure 19:
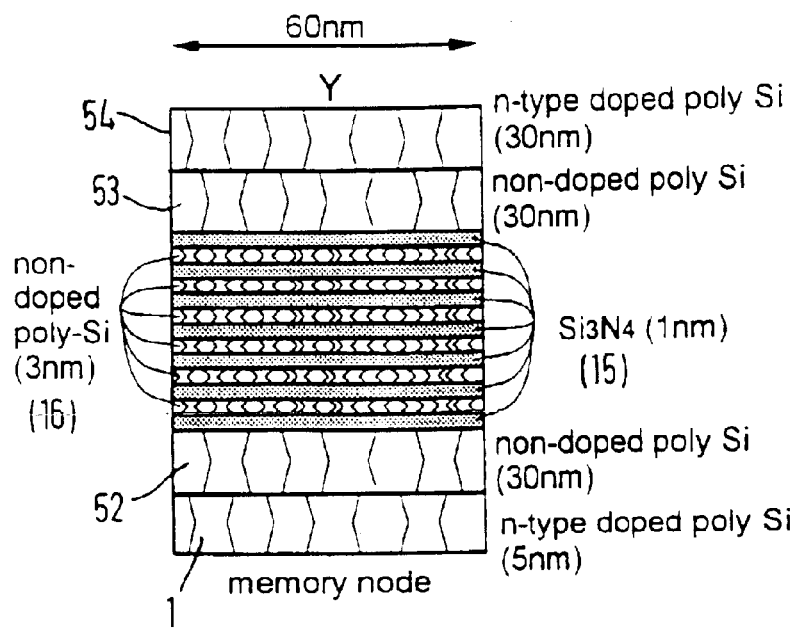
FIG. 19 is an enlarged schematic cross section through the barrier structure shown in FIG. 17.
Figure 20:
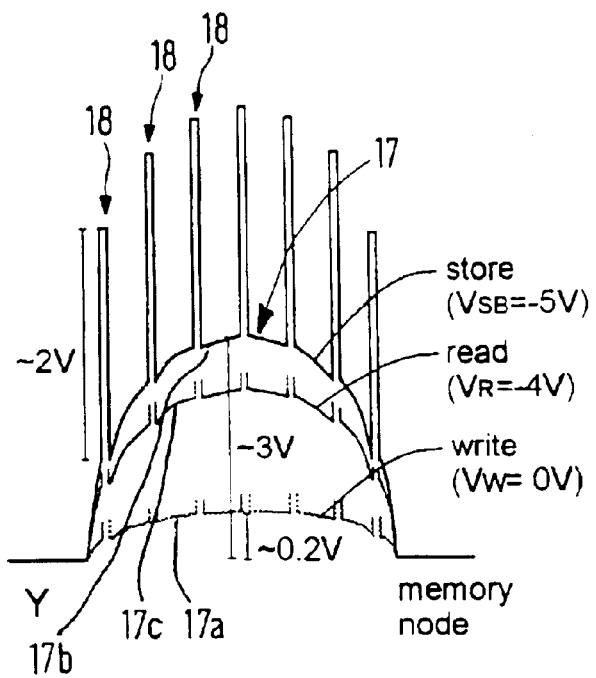
FIG. 20 is a conduction band energy diagram for the barrier structure shown in FIG. 19.

The modulation of the voltage blocking range for the tunnel barrier 2 by the gate 51 will now be explained in more detail with reference to FIGS. 19 and 20. FIG. 19 illustrates a section through the memory node 1, the tunnel barrier configuration 2 and the connection Y. The gate 51 is omitted from FIG. 19 but will be described later. The tunnel barrier configuration consists of alternate layers 15, 16 of non-doped polysilicon of thickness 3–10 nm and silicon nitride of thickness 1–3 nm formed in the manner described previously with reference to FIG. 10. The memory node 1 consists of a n-type doped polysilicon layer with thickness 5–30 nm and is overlaid by a non-doped polysilicon layer 52 of 30 nm thickness. A corresponding non-doped layer 53 is disposed on the other side of the barrier configuration, beneath an n-type doped polysilicon layer 54 of 30 nm thickness.

As can be seen in the energy band diagram of FIG. 20, the seven insulating silicon nitride layers 15 give rise to corresponding relatively narrow and relatively high barrier components 18 in a similar manner to that described with reference to FIG. 11, together with a relatively wide but low barrier component 17. The effect of applying a voltage to gate 51 is to raise and lower the barrier component 17 selectively, together with the barrier components 18, which are dragged up and down accordingly.

In the write process, the voltage $V_X$ applied to terminal X (FIG. 17) is set to a write voltage $V_W$ (0V) and as a result the height of the wide barrier component 17, which is in effect an internal electrostatic potential in the barrier configuration, is at a relatively low value of the order of 0.2V in this example. Thus, electrons can tunnel through the narrow barrier components 18 and are not impeded by the low wide barrier component 17a, so that electrons tunnel from the terminal Y onto the memory node 1.

Stored charge on the node 1 can be retained by raising the voltage $V_X$ to a standby voltage $V_{SB}$, in this example −5V. This raises the overall height of the relatively wide barrier component 17 to the level 17b, which in this example is of the order 3V. The resulting increased height of the barrier component 17 inhibits charge carrier tunnelling from the memory node 1 so that information can be retained on the node for long periods of time ~10 years.

In order to read information, $V_X$ is set to a read voltage $V_R$ which in this example is of the order of −4V. As will be explained hereinafter, this keeps the charge stored on memory node 1 but allows information to be read from the source/drain path of the device during a relatively short read cycle ~100 ns. The barrier component 17 assumes the shape 17c shown in FIG. 20.

Seventh Embodiment

Figure 23:
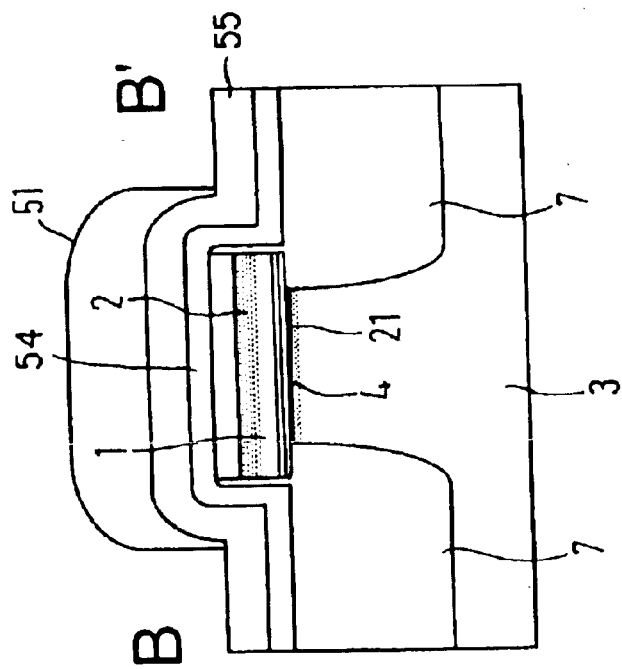
FIG. 23 is a cross sectional view taken along the line B–B' of FIG. 21.

A more detailed structure of an array of such devices will now be described with reference to FIG. 21 which shows a rectangular array of four cells in plan view, together with FIGS. 22 and 23 which illustrate sections through one of the cells, along the lines A–A' and B–B' of FIG. 21 respectively. Referring to FIG. 22, the general structure of each memory cell is similar to that of the first type as shown in FIG. 5 but with the addition of gate 51, and the same parts are marked with the same reference numbers. Referring to FIG. 22, a p-type substrate 3 includes a conductive path 4 between source and drain regions 5, 6, together with an insulating region 7 to isolate one cell from the next. The device includes a memory node 1 and an overlying barrier structure 2 formed as shown in FIG. 19, with an overlying non-doped polysilicon layer 53 and a bit line formed by the n-type doped polysilicon layer 54. The bit line 54 is covered by electrically insulating CVD $SiO_2$ 55 and $SiO_2$ walls 56, as will be explained in more detail hereinafter. The side gate 51 for the cell consists of a 100 nm thick layer of n-doped polysilicon which extends transversely of the bit line and overlies side edges 57 of the barrier structure 2.

Referring again to FIG. 21, it can be seen that the drains 6 for adjacent memory cells in a particular row make use of a common drain region 6, which reduces the memory cell size.

Figure 21:
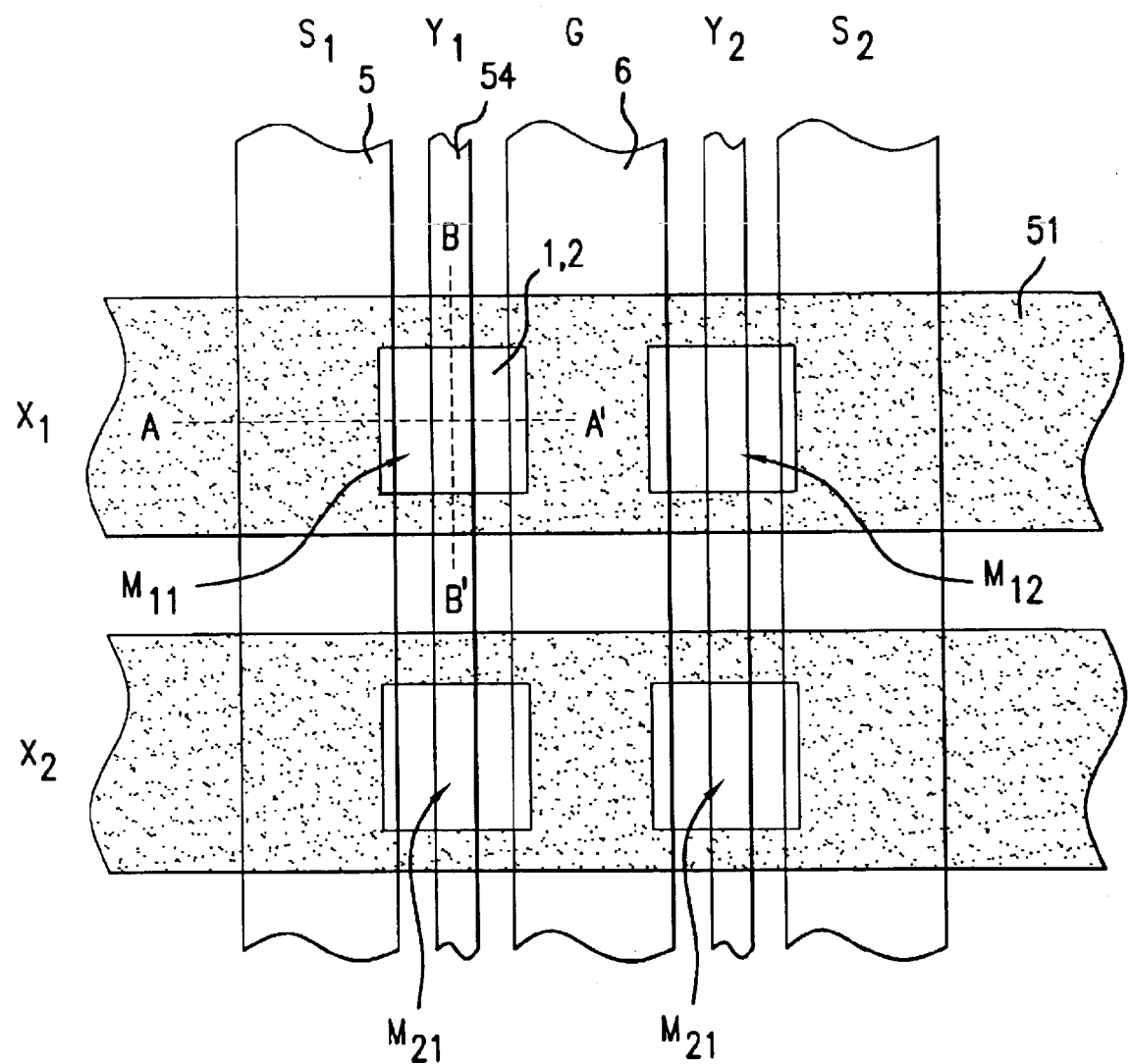
FIG. 21 is a schematic plan view of a memory cell array, incorporating memory devices of the second type shown in FIG. 17.
Figure 22:
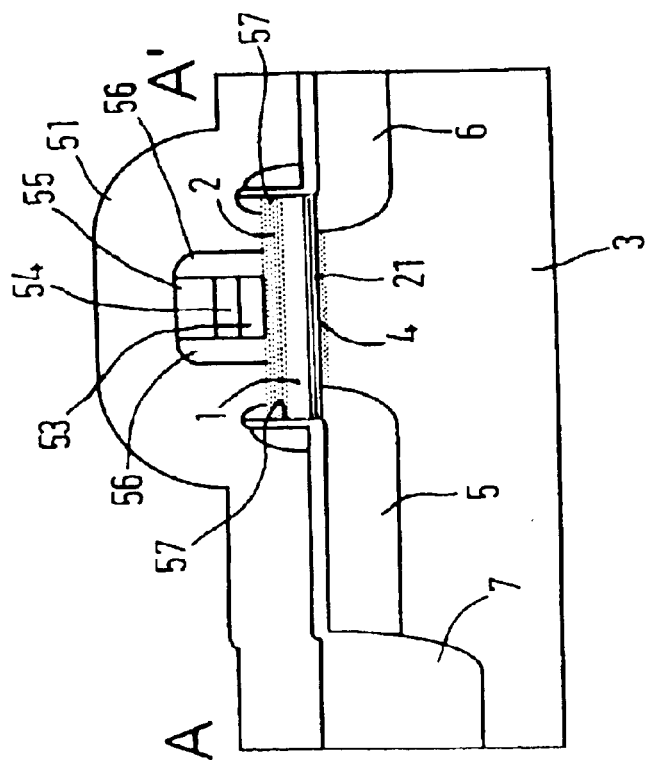
FIG. 22 is a cross sectional view taken along the line A–A' of FIG. 21.

Information can be written to a particular cell e.g. memory cell $M_{11}$ shown in FIG. 21, by applying a write voltage $V_W$ to word line $X_1$ (51) and an appropriate voltage to bit line $Y_1$ (54) depending on binary code "0" or "1". This causes charge to be written on the memory node 1 of memory cell $M_{11}$ corresponding to binary "0" or "1" depending on the voltage of the bit line $Y_1$. The data is not written to the other memory cells in the column because the other cells receive the standby voltage $V_{SB}$ on their word lines $X_2$, etc. Thereafter, a standby voltage $V_{SB}$ is applied to the word line $X_1$ to retain the data on the node 1 of the cell $M_{11}$. No voltage needs to be applied to the bit line. When it is desired to read the stored data from cell $M_{11}$, a read voltage $V_R$, lower than the standby voltage $V_{SB}$ is applied to word line $X_1$. Peripheral circuits (not shown) sense the source/drain conductance of the cell $M_{11}$ by sensing the current flow between lines $S_1$ and G (lines 5, 6). Other memory cells in column are biassed off by the standby voltage $V_{SB}$ applied to their word lines $X_2$ etc, and so these cells are not addressed by the reading of $M_{11}$.

Furthermore, another method of operating the circuit can be used, similar to the usual method employed with a conventional DRAM, in which the stored information is transferred to peripheral circuits and is then replaced by new information which is written to each memory node. This method has the advantage of permitting a wide tolerance in the design value of the voltage blocking region $V_B$ which thereby permits significant variations in the values of $V_{CL}$ and $V_{CH}$ to occur from cell to cell. Binary "1" is represented by a memory node voltage $V_H$ and binary "0" is represented by a memory node voltage $V_L$. The only requirement for the circuit is that $V_{CH}$ is larger than $V_H$ and that $V_{CL}$ is smaller than $V_L$, that is $V_{CH} > V_H > V_L > V_{CL}$ and it is not actually necessary to specify the values. This wide design tolerance makes it possible to integrate a large number of memory cells in a chip.

Figure 24:
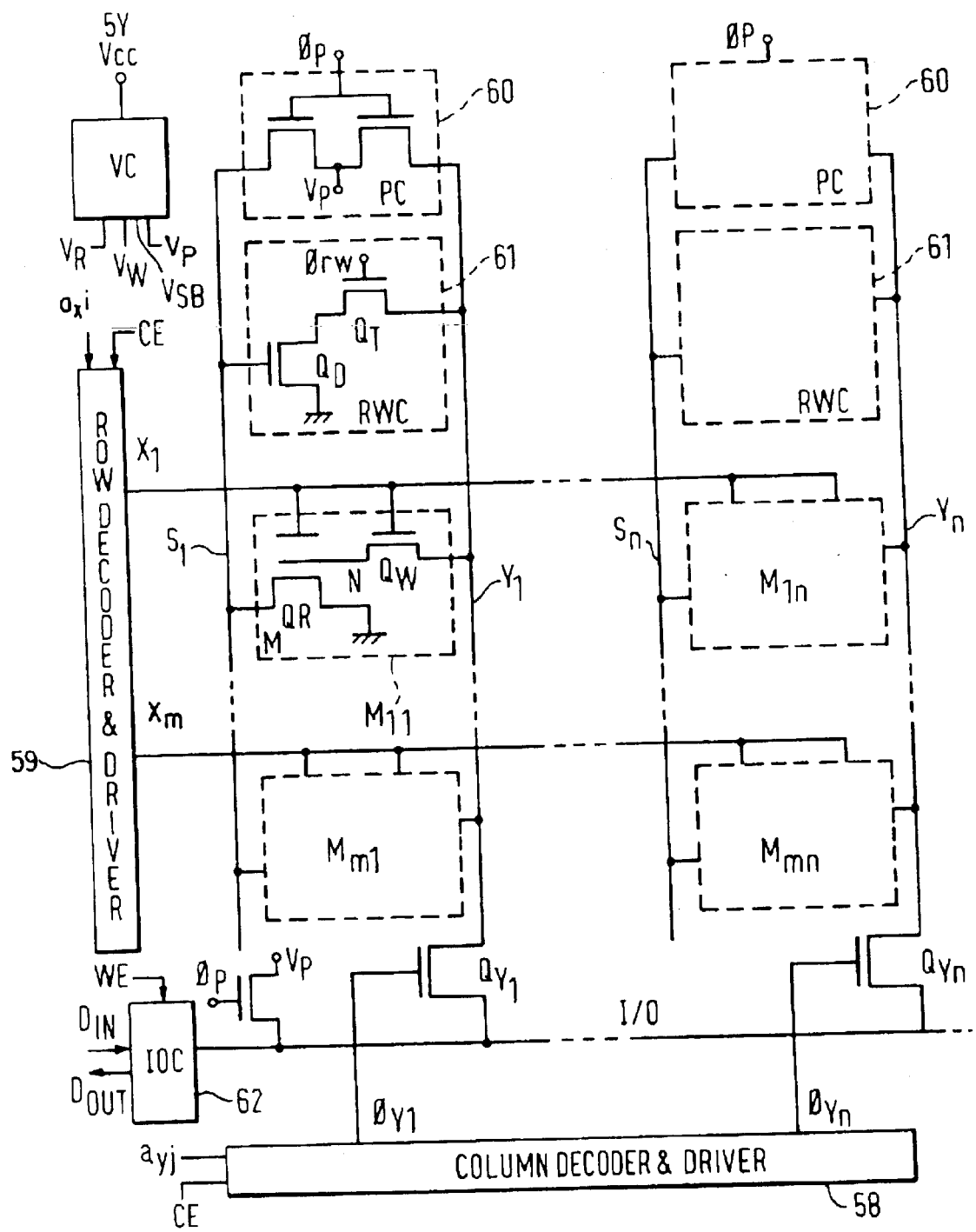
FIG. 24 is a schematic circuit diagram of the memory cell configuration shown in FIGS. 21, 22 and 23, together with on-chip drivers and other peripheral devices.

The details of this method of operation will now be described with reference to FIGS. 24 to 26. FIG. 24 illustrates schematically the circuit diagram of the memory cell array, corresponding to FIG. 21 and additionally showing the peripheral circuits which are incorporated on the same semiconductor substrate 3 as the memory cell array. Each memory cell $M_{11}$–$M_{mn}$ corresponds to a memory device of the second type, as previously described, although the circuit is represented by an equivalent circuit consisting of two transistors $Q_R$ and $Q_W$. The memory node 1 is represented by N. The configuration is shown for memory cell $M_{11}$ in FIG. 24. The chip includes a column decoder and driver 58, a row decoder and driver 59, an on-chip voltage converter VC which produces a number of control voltages described in more detail hereinafter, from an external voltage supply $V_{CC}$, which in this example is a 5V supply. Each column of memory cell arrays has an associated precharge circuit 60 (PC) and a read/re-write circuit 61 (RWC). PC 60 and RWC 61 are shown in detail for the column n=1 of the memory cell array and the corresponding circuits for column n are shown in hatched outline.

A data input/output circuit 62 receives data from an external source and transmits data out from the memory array in a manner to be described in more detail hereinafter.

Figure 25:
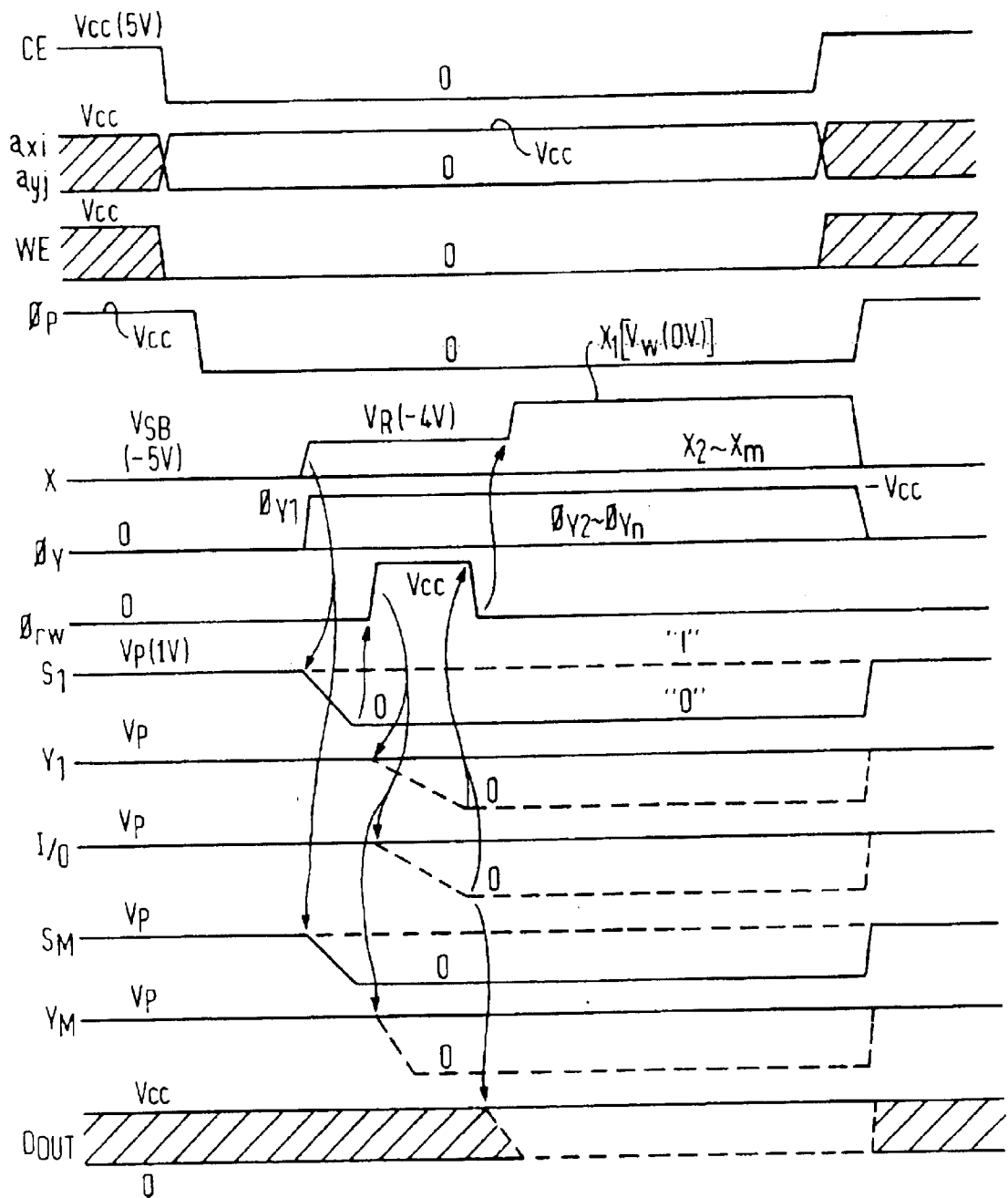
FIG. 25 is a waveform diagram illustrating a process for reading information from the memory cell $M_{11}$.
Figure 26:
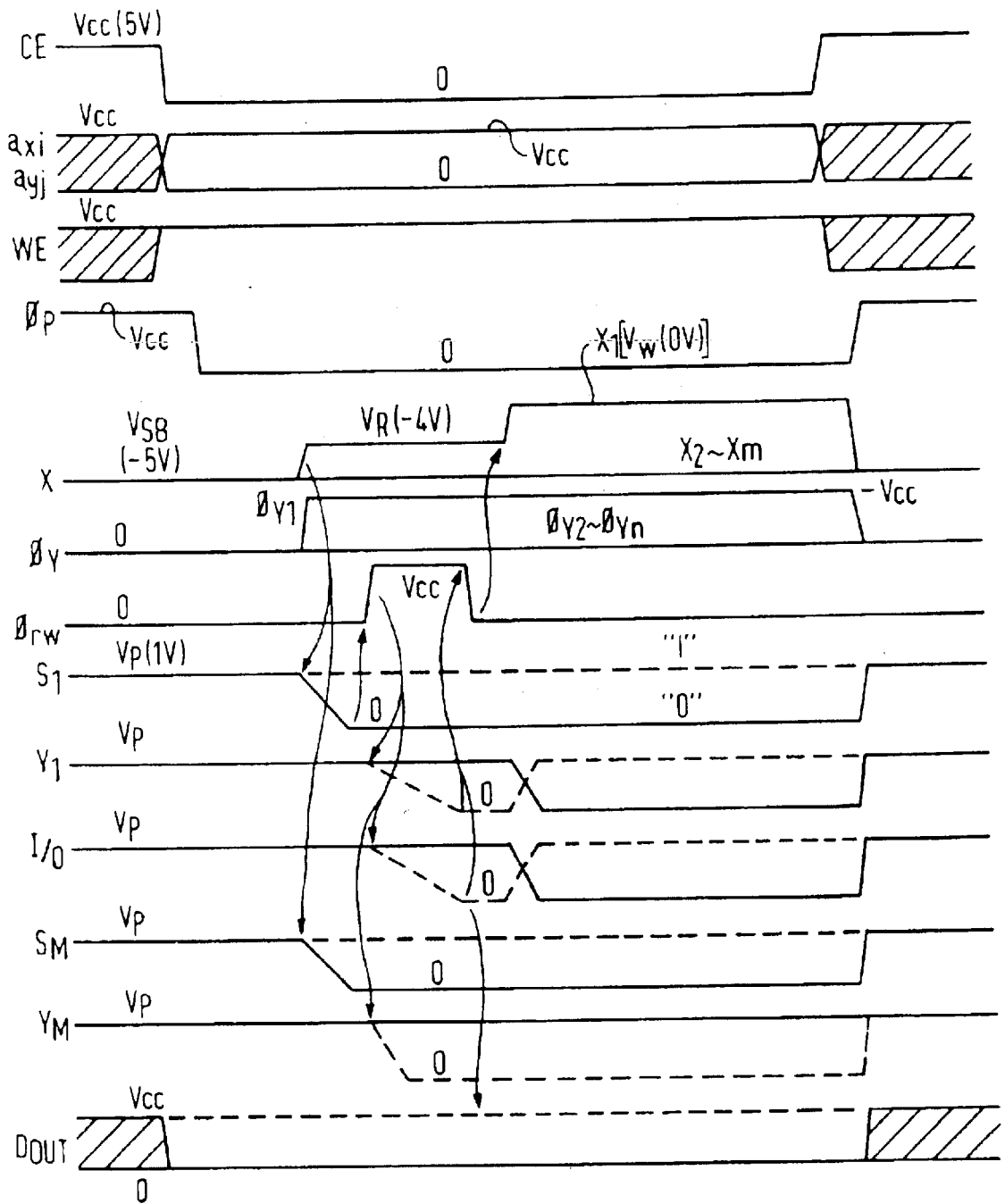
FIG. 26 is a waveform diagram illustrating a process for writing data to the memory cell $M_{11}$.

The nomenclature of the various signals, lines and components used in FIGS. 24, 25 and 26 is summarised in the following table:

TABLE

| Item | Name |
|---|---|
| $M_{11}$–$M_{mn}$ | memory cells |
| m | memory cell array row |
| n | memory cell array column |
| $S_1$–$S_n$ | sense lines |
| $Y_1$–$Y_n$ | data input lines |
| $X_1$–$X_m$ | word lines |
| $\phi_{y1}$–$\phi_{yn}$ | column selection signals |
| I/O | common data input/output |
| PC | precharge circuit |
| $\phi_P$ | precharge signal |
| RWC | read/write circuit |
| $\phi_{rw}$ | read/write signal |
| $a_{xi}$ | row address signals |
| $a_{yi}$ | column address signals |
| CE | chip enable signal |
| $D_{in}$ | data input |
| $D_{out}$ | data output |
| WE | write enable signal |
| VC | on-chip voltage converter |
| $V_R$ | read power supply voltage |
| $V_W$ | write power supply voltage |
| $V_P$ | precharge power supply voltage |
| $V_{SB}$ voltage | standby power supply |
| $V_{CC}$ | externally applied voltage |
| IOC | data input/output circuit |

A data reading operation will now be described with reference to FIG. 25. When the chip enable signal CE is at the voltage of $V_{CC}$, hereinafter denoted as "high", the chip is inactive. In this condition, precharge signal $\phi_P$ is "high", and $S_1 \ldots S_n$, $Y_1 \ldots Y_n$, and I/O are precharged to a voltage $V_P$ because the transistors of PC 60 are in an "on" state. When CE is changed from "high" to zero voltage (hereinafter denoted as "low"), the chips become active. Then $\phi_P$ becomes "low" to turn the transistors of PC 60 "off". Then the voltages of lines $S_1 \ldots S_n$, $Y_1 \ldots Y_n$, float, keeping the voltage value $V_P$. A word line is selected by applying row address signals ($a_{xi}$) to the row driver 59. When a read voltage $V_R$ is applied on $X_1$, the information from a first row of memory cells $M_{11} \ldots M_{1n}$ is read, and the output signals appear on the fill corresponding sense lines, $S_1 \ldots S_n$. Considering, as an example, memory cell $M_{11}$, when the voltage on the memory node N is $V_P$, the transistor $Q_R$ is in an "on" state, and the corresponding sense line, $S_1$, is discharged to 0V. Alternatively, when the voltage on the memory node is 0V, $S_1$ is kept to $V_P$ because the transistor $Q_R$ is in an "off" state. After the voltage on $S_1$ has settled to 0V or $V_P$, the read/write signal $\phi_{rw}$ becomes "high", and the information of $S_1$ is transferred to $Y_1$ through RWC 61. That is, when $S_1$ is 0V, $Y_1$ is kept to $V_P$ because $Q_D$ is in its "off" state. However, when $S_1$ is $V_P$, $Y_1$ is discharged to 0V because both transistors $Q_D$ and $Q_T$ are in an "on" state. Then $\phi_{y1}$ becomes high selectively in response to applied column address signals ($a_{yj}$), so that $Q_{Y1}$ is turned "on". Thus, the voltage change of $Y_1$ is transferred to data output $D_{out}$ through input/output line I/O and the IOC 62. After $Y_1$ has settled to 0V or $V_P$, the voltage on word line $X_1$ is changed to write voltage $V_W$, so that the transistor $Q_W$ is turned "on" and the voltage of $Y_1$ is restored to the memory node N. In this way, even if there are any disturbances to the memory node voltage during the read operation, the information is refreshed to 0V or $V_P$. The read and re-write operations are also performed on the other cells in the same row, $M_{12} \ldots M_{1n}$, but the read-out information is not transferred to I/O line, as in the case of cell $M_{11}$. When the read and re-write operations finish, CE becomes high, $X_1$ is set to standby voltage $V_{SB}$ and then $\phi_P$ becomes high.

Next, the write operation is explained. As an example, the write operation for the memory cell $M_{11}$ is shown in FIG. 26. By the same operation as described in the read operation, the stored information on $M_{11}$ is transferred to $S_1$ and $Y_1$. Then a voltage corresponding to input data $D_{in}$ is applied on the I/O, and the read information on $Y_1$ is replaced by this voltage. This is then stored on the memory node N by applying the write voltage $V_W$ on the word line $X_1$. The other cells in the same row, $M_{12} \ldots M_{1n}$, can be refreshed during the same operation. It will be understood that this process is repeated sequentially, row by row in order to write data to all the cells of the memory array.

An example of method of fabricating a memory cell according to the embodiment of shown in FIGS. 21 to 23 will now be described with reference to FIG. 27.

Figure 27A:
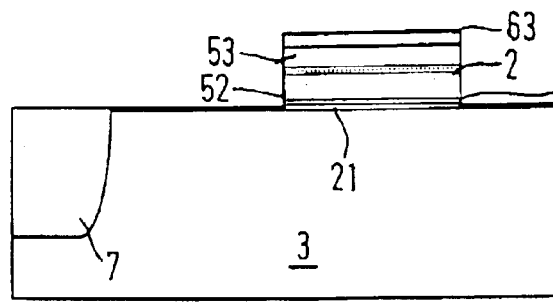
FIGS. 27a–e illustrate process steps for manufacturing the memory device shown in FIGS. 21 to 23.

Referring to FIG. 27a, the 10 Ωcm p-type silicon substrate wafer 3 is thermally oxidised to form the 5 nm thickness $SiO_2$ layer 21. Then a 10 nm thick n-type doped silicon film 1, which forms the memory node, is deposited on the layer 21. This is overlaid by a 30 nm thick non-doped silicon film 52. The surface of the film 52 is converted to a 1 nm thickness silicon nitride layer in $NH_3$ ambient at a temperature of 700° C. in order to form the first of the layers 15, shown in FIG. 19. The thickness of the silicon nitride layer can be controlled by controlling the growth temperature, from 2.5 nm at 1000° C. to 1 nm at 700° C. Then a non-doped silicon layer 16 is deposited and nitrided to form another 1 nm thickness silicon nitride layer 15. This process is repeated six times sequentially forming the multiple tunnel junction 2, comprising seven sets of overlaid layers 15, 16 shown in more detail in FIG. 19. Then, a 30 nm thickness non-doped silicon film 53 is deposited, which in turn is overlaid by a 20 nm $Si_3N_4$ film 63 that is deposited for masking purposes, and is patterned by lithography and dry etching in an atmosphere of $CHF_3$ and argon gas.

The silicon and silicon nitride layers 53, 15, 16, 52 and 1 are then etched out by using a dry etching method well known per se.

Figure 27B:
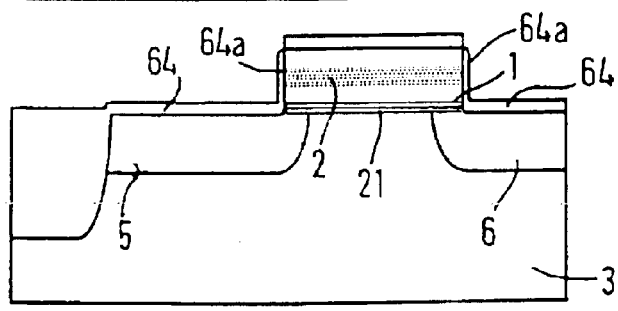

Referring to FIG. 27b, the surface of the wafer is oxidised to form a 30 nm thickness $SiO_2$ 64, with side edges 64a on the vertical sides of the barrier configuration 2 using the $Si_3N_4$ film 63 as a mask. Arsenic ions are implanted to form the source and drain regions 5, 6.

Figure 27C:
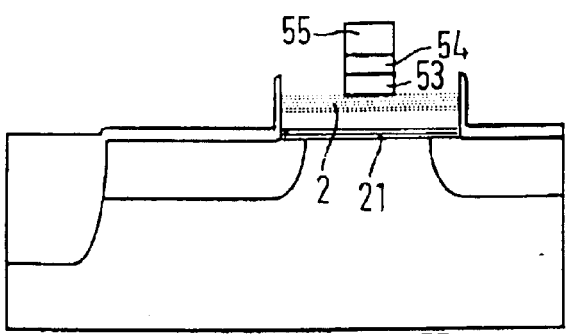

Then, as shown in FIG. 27c, the $Si_3N_4$ film 63 is removed and the 30 nm thickness n-type doped silicon film 54 is deposited, followed by a 50 nm thickness $SiO_2$ film 55, by a conventional CVD process. Then, the layer 55 is patterned by conventional lithography and dry etching methods. The width of the bit line, i.e. the width of line $Y_1$ (54) shown in FIG. 21, is selected to be 60 nm, which provides good controllability of the internal electrostatic potential of the device. The thickness of the various layers in the bit line $Y_1$ can be selected in dependence upon the size of the memory cell array. The layers should be made thicker for wider bit lines. Using resist and the $SiO_2$ film 55 as a mask, the layers 54 and 55 are selectively etched in an atmosphere of $Cl_2$ gas until the first silicon nitride layer of the tunnel barrier configuration 2 is exposed.

Figure 27D:
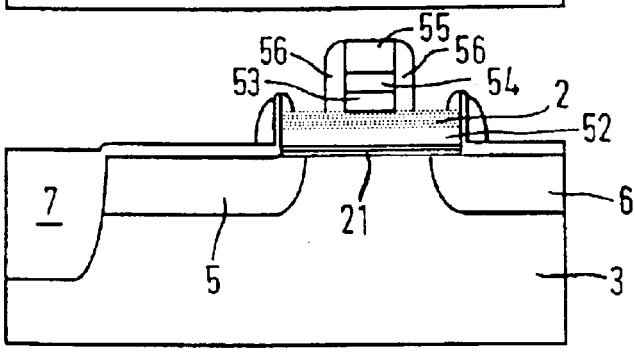

Referring to FIG. 27d, a 30 nm thickness CVD $SiO_2$ layer is deposited and dry etched in an atmosphere of $CHF_3$ and argon gas in order to provide side walls 56.

Figure 27E:
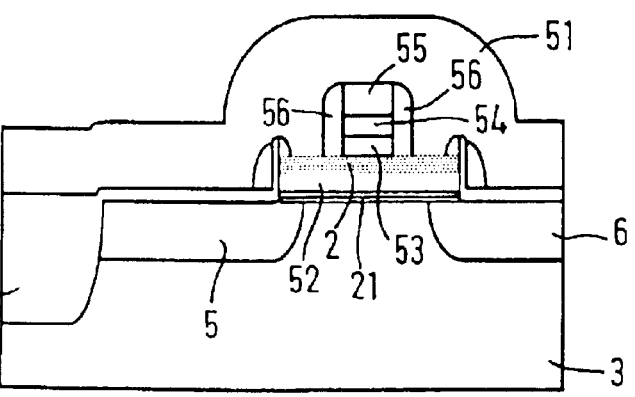

Referring to FIG. 27e, the polycrystalline silicon layer 51 is thereafter deposited and patterned by conventional lithography and dry etching methods, in order to define the word line.

The n-type and p-type MOS transistors that are used in the peripheral circuits 60, 61 etc shown in FIG. 24 can be fabricated in the same substrate 3 by conventional methods. The source and drain regions for the n-type MOS transistors can be formed at the same time as the fabrication of the source and drains 5, 6 of the memory cells $M_{mn}$, as described with reference to FIG. 27b.

In this embodiment, it is necessary to apply a standby voltage $V_{SB}$ of −5V on the word lines in order to maintain the stored information on the individual memory nodes 1. This can be achieved when the device is switched off, by using an external battery or capacitor. Because no significant current is drawn, except a negligibly small leakage current, effectively non-volatile characteristics can be obtained. In a modification described later, the use of an external battery or capacitor is avoided by shifting all of the voltages upwardly by +5V. In this case, the standby voltage becomes 0V and thus an external battery is not needed.

Eighth Embodiment

Figure 28:
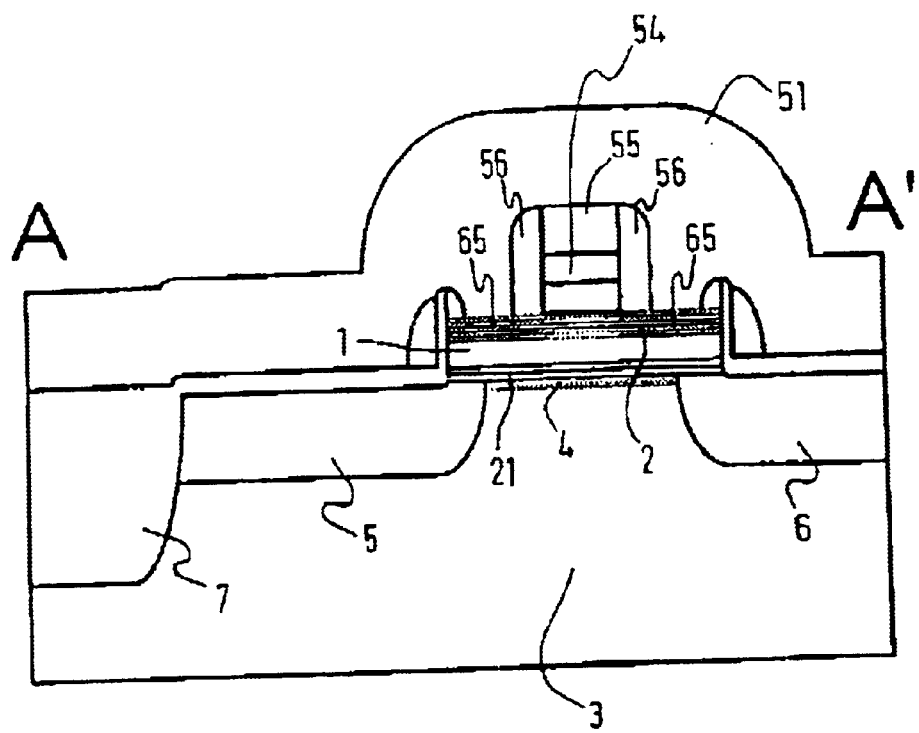
FIG. 28 is a schematic cross section of a modification to the memory device.

One method to shift the standby voltage is shown in FIG. 28, where p-type doped region 65 is formed under the contact regions of word lines. The configuration can be considered as a modification of that shown in FIG. 22. The p-type doped region 65 is formed by ion implantation of boron ions using $SiO_2$ 55–56 as a mask after the process step shown in FIG. 27(d). The voltage on word line is shifted by around 1V at room temperature. In this structure there is another advantage that the internal electrostatic potential, hence conduction energy band edge, can be controlled more effectively. Due to the effects of lateral spreading of implanted boron ions and the resulting built-in potential of the formed implant p-i junction, the effective bit line width can be much smaller than the real bit line width, so that even 1 μm bit line width is enough to realise the present memory device, instead of 0.06 μm bit line width in the seventh embodiment. In this structure, $V_{SB}$=4V, $V_R$=3V, and $V_W$=1V.

Ninth Embodiment

Figure 29:
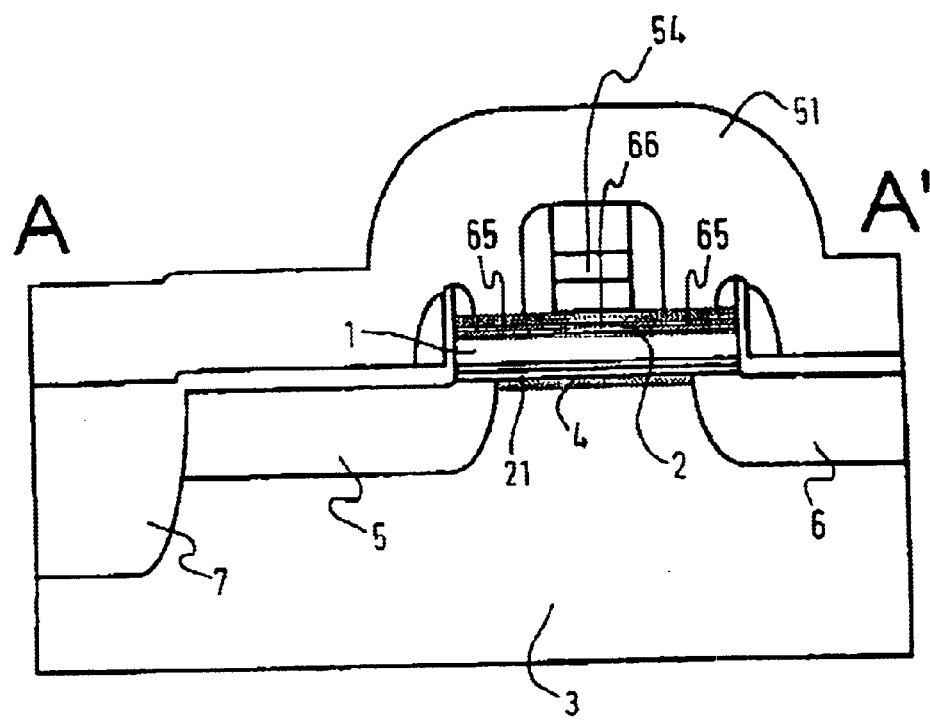
FIG. 29 is a schematic cross section of a further modification to the device.

Furthermore, a thin p-type doped layer 66 can be formed inside the barrier structure as shown in FIG. 29, resulting in even a larger built-in potential. The configuration of FIG. 29 can be considered as a modification of that shown in FIG. 28. Such p-type layer 66 can be formed easily be depositing p-type silicon film or implanting boron ions at the intermediate stage forming barrier structure because it is formed by repeated deposition method. To reduce diffusion of boron, the p-type doped layer 66 is sandwiched by thin tunnel barriers 15 in FIG. 19. In this case the word line voltage directly controls the internal electrostatic potential, hence conduction energy band edge. This reduces the voltage difference on the word line between stand-by and write cycles. In this structure, $V_{SB}$=−2V, $V_R$=−1V, and $V_W$=1V.

Tenth Embodiment

Figure 30:
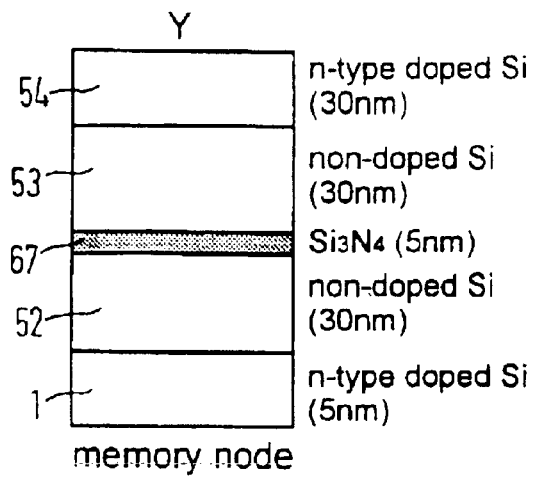
FIG. 30 is a schematic cross section through an alternative barrier structure for use in the second type of memory device according to the invention.
Figure 31:
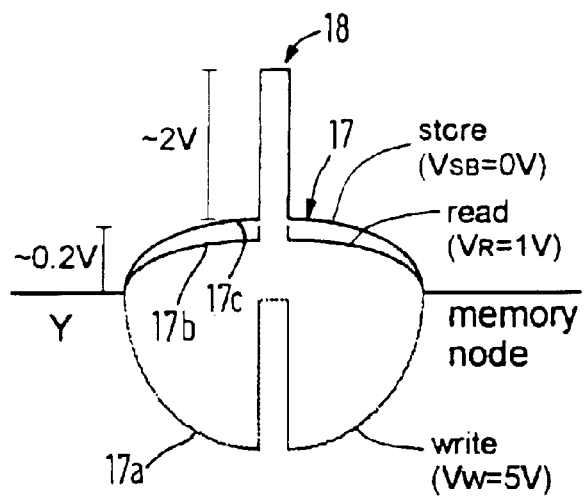
FIG. 31 is a conduction energy band diagram corresponding to the barrier structure shown in FIG. 30.

In this embodiment, a thicker tunnel barrier, of the order of 5 nm is used, as shown in FIG. 30. The configuration of FIG. 30 can be considered as a modification of that shown in FIG. 19 and the barrier structure can be incorporated into the device described with reference to FIGS. 21 to 23. The memory node 1 in FIG. 30 is overlaid by the non-doped polysilicon layer 52 of 30 nm thickness, which itself is overlaid by a single barrier layer 67 of 5 nm thickness, formed of $Si_3N_4$ material. The $Si_3N_4$ film can be formed by plasma nitridation at a temperature of 550° C. and at a power level of 300–500W. This is overlaid by a non-doped Si layer 53 of 30 nm thickness and a n-type doped Si layer 54 of 30 nm thickness, described previously with reference to FIG. 19. The resulting conduction energy band diagram for the barrier structure is shown in FIG. 31 and consists of a relatively wide barrier component 17 of relatively low barrier height together with a relatively narrow barrier component 18, produced by the layer 67, of relatively high barrier height. In this example, the barrier height is of the order of 2 volts, produced by the 5 nm thick layer of insulating $Si_3N_4$. During a write operation, the write voltage is applied to the side gate 51 (not shown) in FIG. 30. In this example, the write voltage $V_W$=5V lowers the barrier configuration in a transient state such that the relatively wide barrier component assumes the configuration 17a shown in FIG. 31. For reading data, the voltage $V_R$=1V is applied to the gate 51 so that the barrier assumes configuration 17b. In this arrangement, data can be read from the memory device. To store information, a standby voltage $V_{SB}$=0V is used such that the configuration 17c positively blocks leakage of charge from the memory node 1 with 0V applied to the word line X.

Type 3

Eleventh Embodiment

Figure 32:
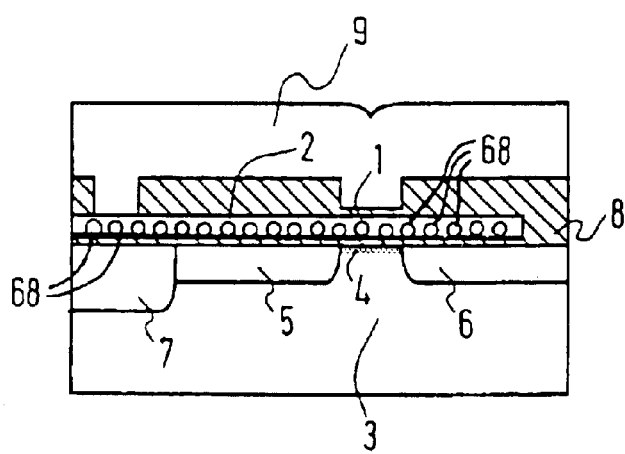
FIG. 32 is a schematic cross section through a third type of memory device in accordance with the invention.

Another type of memory device in accordance with the invention is shown schematically in FIG. 32. The device is generally similar to the embodiment described with reference to FIGS. 4 and 5 and like parts are marked with the same reference numbers. In the embodiment of FIG. 32, the barrier structure consists of an array of lateral dots 68. The dots can be fabricated by a number of different ways such as an ionised beam deposition method as described in W. Chen, H. Ahmed and K. Nakazato, Applied Physics Letters, 12 Jun. 1995, Vol. 66, No. 24, pp. 3383–3384 or by single atom lithography as described by H. Ahmed, Third International Symposium on New Phenomena in Mesoscopic Structures, December 1995. Furthermore, the lateral dots 68 could be replaced by grains in a polycrystalline silicon film for example as described by Yano et al supra, by nano-crystals as described by the method in the present third, fourth and fifth embodiments, and by colloidal particles as described by the method in the present sixth embodiment.

Many variations and modifications fall within the scope of the present invention. For example, the various regions of n-type and p-type material could be exchanged with one another to produce devices with complementary conduction characteristics to those described hereinbefore. Also, the thickness of the different layers that make up the described examples of layered tunnel barrier junctions may be altered from the specific examples given hereinbefore. Also, different insulating materials could be used. For example silicon oxide could be used instead of silicon nitride as a tunnel barrier. Furthermore, other semiconductor fabrication systems could be used, with a different basic substrate, such as silicon on insulator, SiGe, Ge, GaAs and others well known to those in the art. Also, the various different embodiments of barrier structure and the modifications thereof described for use in the first type of memory device according to the invention, can be used in embodiments of the second type with a side gate 51, and embodiments according to the second type can be modified for use without the side gate, or with a fixed voltage applied to the side gate, so as to operate according to the principles of the first type.

What is claimed is:

1. A memory device comprising a substrate, an insulating layer overlying the substrate, and an electrode structure, a charge storage node and a lamination structure overlying the insulating layer, the lamination structure including an insulating film and a semiconductor film, the lamination structure being disposed between the electrode structure and the charge storing node, the lamination structure having an energy band profile that is changeable between a first configuration in which a barrier height of the energy band profile is high and a second configuration in which the barrier height of the energy band profile is low, an electric current flowing in the second configuration from the electrode structure to the charge storing node and vice versa in response to given voltages applied to the device so as to charge and discharge the node selectively through the lamination structure, and wherein charge is stored on the node in the first configuration.

2. A memory device according to claim 1, wherein the memory device has a control electrode operable to change the energy band profile between the first and the second configuration.

3. A memory device comprising:
a path for charge carriers;
a charge storing node to produce a field which alters a conductivity of the path;
an insulating layer between the path and the charge storing node;
an electrode structure; and
a lamination structure including an insulating film and a semiconductor film,
the lamination structure being disposed between the electrode structure and the charge storing node,
the lamination structure having an energy band profile that is changeable between a first configuration in which a barrier height of the energy band profile is high and a second configuration in which the barrier height of the energy band profile is low, an electric current flowing in the second configuration between the electrode structure and the charge storing node and vice versa in response to given voltages applied to the device so as to charge and discharge the node selectively through the lamination structure, and wherein charge on the node is stored in the first configuration.

4. A memory device according to claim 3, wherein the memory device has a control electrode, the energy band profile being changed between the first configuration and the second configuration in response to a voltage supplied to the control electrode.

5. A memory device comprising:
a substrate;
a source-drain path in the substrate for charge carriers;
an insulating layer over the source drain path;
a charge storing node over the insulating layer to produce a field which alters a conductivity of the source-drain path;
an electrode structure; and
a lamination structure including an insulating film and a semiconductor film,
the lamination structure being disposed between the electrode structure and the charge storing node,
the lamination structure having an energy band profile that is changeable between a first configuration in which a barrier height of the energy band profile is high and a second configuration in which the barrier height of the energy band profile is low, an electric current flowing in the second configuration from the electrode structure to the charge storing node and vice versa in response to given voltages applied to the device so as to charge and discharge the node selectively through the lamination structure, and wherein charge on the node is stored in the first configuration.

6. A memory device according to claim 5 wherein the memory device has a control electrode, the energy band profile being changed between the first configuration and the second configuration in response to a voltage supplied to the control electrode.

7. A memory device according to claim 5 wherein the insulating film and the conductive film of the lamination structure are formed of silicon nitride and silicon material, respectively.

8. A memory device according to claim 7 wherein the lamination structure further includes another film of silicon nitride, the silicon material being disposed between the silicon film and the other silicon nitride film.

9. A memory device according to claim 7 wherein the lamination structure further includes another film of silicon material, the silicon nitride film being disposed between the film of silicon material and the other film of silicon material.

10. A memory device according to claim 7 wherein the silicon material comprises polysilicon.

11. A memory device according to claim 8 wherein the silicon material comprises polysilicon.

12. A memory device according to claim 9 wherein the silicon material comprises polysilicon.

13. A memory device comprising:
a substrate;
a charge storage node,
an insulating layer between the charge storage node and the substrate;
an electrode structure, and
a barrier structure between the electrode structure and the charge storage node, the barrier structure providing a variable internal electrostatic barrier potential configurable by an external bias to provide selectively a relatively low barrier height for which charge carriers can pass from the electrode structure to the charge storage node and vice versa to charge and discharge the node, and a relatively high barrier height to store charge carriers on the charge storage node.

14. A memory device according to claim 13 wherein the barrier structure includes a region of barrier material providing a barrier component which is narrower and higher than that provided by the internal electrostatic barrier potential.

15. A memory device according to claim 14 wherein the height of said barrier component is raised and lowered in response to raising and lowering of the height of the barrier provided by the variable internal electrostatic barrier potential.

16. A memory device according to claim 14 wherein the region of barrier material is formed of a material selected from the group consisting of silicon dioxide and silicon nitride.

17. A memory device according to claim 14 including a further said region of barrier material providing a barrier component which is narrower and higher than that provided by the internal electrostatic barrier potential.

18. A memory device according to claim 1 including a gate to receive said external bias to configure the barrier between said high and low barrier heights.

19. A memory device comprising:
a substrate;
an array of memory cells configured on the substrate; and
a plurality of word lines and data lines extending between the cells, the word lines being operable to receive cell selection signals;
each of the memory cells comprising a charge storage node, an electrode forming part of one of the data lines, and a barrier structure between the electrode and the charge storage node, the barrier structure providing a variable internal electrostatic barrier potential configurable selectively in response to an external bias provided by a selection signal applied to one of the word lines to provide a relatively low barrier height for which charge carriers can pass between the electrode structure and the charge storage node for charging and discharging the node, and a relatively high barrier height to store charge carriers on the charge storage node.

20. A memory device according to claim 19 wherein each of the memory cells includes a source-drain path with a conductivity which is altered as a function of the charge stored on the charge storage node, and the device further including a plurality of sense lines coupled to the source drain paths of the cells, and refreshing circuitry responsive to the sense lines to refresh data on the data lines.

21. A memory device according to claim 13 wherein the barrier structure is formed of crystalline material.

22. A memory device according to claim 13 wherein the barrier structure includes polycrystalline silicon.

23. A memory device according to claim 13 including a gate to apply said external bias to the barrier structure.

24. A memory device according to claim 13 including a substrate and configured so that the charge storage node is formed overlying the substrate, the barrier structure overlies the charge storage node, and the electrode structure overlies the barrier structure.

25. A memory device according to claim 24 including an insulating layer overlying the substrate, the charge storage node, barrier structure and the electrode structure overlying the insulating layer.

26. A memory device according to claim 25 including further device features formed in the substrate, the further device features underlying the insulating layer.

27. A memory device according to claim 25 wherein the insulating layer comprises an oxide of the material of the substrate.

28. A memory device according to claim 25 wherein the insulating layer extends over side edges of the barrier structure and the charge storage node.

29. A memory device according to claim 24 wherein the barrier structure is substantially co-extensive with the charge storage node.

30. A memory device according to claim 13 wherein the barrier structure has a material composition that provides an internal relatively high internal electrostatic barrier in the absence of an applied voltage to the electrode structure, whereby the electrostatic barrier can be lowered upon application of the external bias to the electrode structure.

31. A memory device according to claim 25 including a gate configured to apply said external bias into the barrier structure selectively to control conduction of charge carriers between the electrode structure and the charge storage node.

32. A memory device according to claim 13 wherein the charge storage node is made of conductive silicon material.

33. A device according to claim 19 including refresh circuitry to refresh the level of charge stored on the charge storage nodes individually.

34. A device according to claim 19 including reading circuitry to read the level of charge stored on the charge storage nodes of the cells individually.

35. A device according to claim 19 including writing circuitry to write charge to the charge storage nodes of the cells individually.

36. A memory device according to claim 19 wherein the barrier structure is formed of crystalline material.

37. A memory device according to claim 19 wherein the barrier structure includes polycrystalline silicon.

38. A memory device according to claim 19 wherein each of the memory cells includes a gate to apply said external bias to the barrier structure.

39. A memory device comprising
a substrate,
an array of memory cells configured on the substrate,
a plurality of word lines and data lines extending between the cells,
each of the memory cells comprising a charge storage node, an electrode structure coupled to one of the data lines and a barrier structure between the electrode structure and the charge storage node, the barrier structure providing an internal electrostatic barrier potential of a relatively high barrier height to store charge carriers on the charge storage node the barrier being configurable selectively in response to an external bias applied to one of the word lines to provide a relatively low barrier height for which charge carriers can pass between the electrode structure and the charge storage node, reading circuitry to read the level of charge stored on the charge storage nodes of the cells individually, and writing circuitry to write charge onto the charge storage nodes of the cells individually.

40. A memory device according to claim 39 including an electrically insulating layer on the substrate with the array of memory cells overlying the insulating layer.

41. A memory device according to claim 39 wherein the substrate is comprised of silicon, the insulating layer is selected from a group comprising an oxide and a nitride of silicon, the charge storage node is formed of a conductive silicon material and the barrier structure is formed of polysilicon material.

42. A memory device comprising:

a substrate, an array of memory cells configured on the substrate, an electrically insulating layer on the substrate, a plurality of word lines and data lines extending between the cells, each of the memory cells comprising a barrier structure and a memory node, the barrier structure overlying the insulating layer and providing an internal electrostatic barrier potential of a relatively high barrier height to keep voltage on the memory node, the barrier being configurable selectively in response to an external bias applied to one of the word lines to provide a relatively low barrier height whereby a current flows through the barrier structure to change the voltage on the memory node, reading circuitry to read the level of charge stored on the memory nodes of the cells individually, and writing circuitry to write charge onto the charge storage nodes of the cells individually.

43. A memory device according to claim 42, wherein the substrate is comprised of silicon, the insulating layer is selected from a group comprising an oxide and a nitride of silicon.

44. A memory device according to claim 42, wherein the memory node is formed of a conductive silicon material.

45. A memory device according to claim 42, wherein the barrier structure is formed of polysilicon material.

46. A memory device according to claim 42, including a control gate configured to control the barrier height presented by the barrier structure to a current that flows to and from the memory node.

47. A memory device according to claim 42, wherein the current that flows to and from the memory node, flows vertically through the barrier structure.

48. A memory device comprising:

a substrate, an array of memory cells configured on the substrate, an electrically insulating layer on the substrate, a plurality of word lines and data lines extending between the cells, each of the memory cells comprising an electrode, a memory node, a barrier structure between the electrode and the memory node, and a control gate, the barrier structure overlying the insulating layer and providing an internal electrostatic barrier potential of a relatively high barrier height to keep voltage on the memory node, the control gate being operable to receive an external voltage bias applied to one of the word lines so as to apply a field to the barrier structure resulting in a relatively low barrier height whereby a current flows through between the electrode and the memory node through the barrier structure to change the voltage on the memory node, and reading circuitry to read the level of charge stored on the memory nodes of the cells individually.

49. A memory device comprising:

a substrate, a horizontal transistor formed in the substrate, and a vertically configured controllable conduction device overlying the horizontal transistor, comprising an electrode, a memory node, a barrier structure between the electrode and the memory node, and a control gate, the barrier structure providing an internal electrostatic barrier potential of a relatively high barrier height to keep voltage on the memory node, the control gate being operable to receive an external voltage bias whereby the barrier structure presents a relatively low barrier height and a current flows between the electrode and the memory node through the barrier structure so as to change the voltage on the memory node.

50. A method of fabricating a semiconductor device, comprising:

providing a substrate, providing an electrically insulating layer on the substrate, fabricating an array of memory cells, providing a plurality of word lines and data lines extending between the cells, each of the memory cells comprising a barrier structure and a memory node, the barrier structure overlying the insulating layer and providing an internal electrostatic barrier potential of a relatively high barrier height to keep voltage on the memory node the barrier being configurable selectively in response to an external bias applied to one of the word lines to provide a relatively low barrier height whereby a current flows through the barrier structure to change the voltage on the memory node, providing reading circuitry to read the level of charge stored on the memory nodes of the cells individually, and fabricating writing circuitry to write charge onto the charge storage nodes of the cells individually.

* * * * *